US012640557B2

(12) United States Patent (10) Patent No.: US 12,640,557 B2

Chavan et al. (45) Date of Patent: May 26, 2026

(54) FAULT CURRENT LIMITING SOLID-STATE SWITCHING DEVICE

(71) Applicant: ABB SCHWEIZ AG, Baden (CH)

(72) Inventors: Govind Chavan, Raleigh, NC (US);
Chunmeng Xu, Raleigh, NC (US);
Zhou Dong, Raleigh, NC (US);
Thorsten Strassel, Baden-Dättwil
(CH); Pietro Cairoli, Raleigh, NC (US)

( * ) Notice: Subject to any disclaimer, the term of this
patent is extended or adjusted under 35
U.S.C. 154(b) by 155 days.

(21) Appl. No.: 18/434,007

(22) Filed: Feb. 6, 2024

(65) Prior Publication Data

US 2025/0253648 A1 Aug. 7, 2025

(51) Int. Cl.
*H02H 9/02* (2006.01)
*G01R 31/327* (2006.01)
*H02H 3/02* (2006.01)
*H02H 3/027* (2006.01)

(52) U.S. Cl.
CPC ......... *H02H 9/025* (2013.01); *G01R 31/3275*
(2013.01); *H02H 3/023* (2013.01); *H02H*
*3/025* (2013.01); *H02H 3/027* (2013.01)

(58) Field of Classification Search
CPC ........ H02H 9/025; H02H 3/023; H02H 3/025;
H02H 3/027; H02H 3/05; H02H 3/087;
G01R 31/3275; H01H 33/596; H01H
71/1081; H01H 9/42; H01H 9/548
See application file for complete search history.

(56) References Cited

U.S. PATENT DOCUMENTS 11,394,199 B2 7/2022 Qi
2013/0070492 A1* 3/2013 Skarby ................. H01H 33/596
363/51

(Continued)

FOREIGN PATENT DOCUMENTS

GB 2375902 A 11/2002
JP H04135025 U * 12/1992

OTHER PUBLICATIONS

Chavan Govind et al., "Performance of a 500A, Unidirectional
IGCT-based Solid-State DC Circuit Breaker for Electric Vehicle
Charging Applications", 2023 IEEE Applied Power Electronics
Conference and Exposition (APEC), pp. 3138-3142; 5 pages.

(Continued)

*Primary Examiner* — Scott Bauer
*Assistant Examiner* — Nicolas Bellido

(57) ABSTRACT

Systems and devices for providing fault current limiting
protection in a power circuit may include a solid-state
switching device (SSSD) including at least one switch
device including a semiconductor device, a voltage clamp-
ing circuit connected in parallel with the at least one switch
device, and one or more circuit breakers connected in series
with the SSSD. The at least one switch device may include
a second semiconductor device. The at least one switch
device may include a first switch device and a second switch
device. The fault current limiting protection includes, to
enable clearing the fault, opening one of the switch devices
to maintain the electric current at a threshold for a defined
period of time, and opening, in response to failing to clear
the fault, the other switch device to interrupt the electric
current between a power source and electrical load(s) con-
nected to the power circuit.

19 Claims, 11 Drawing Sheets

(56) References Cited

U.S. PATENT DOCUMENTS

| 2013/0278078 A1* | 10/2013 | Ohlsson | ................. | H02H 3/025 |
| | | | | 307/113 |
| 2022/0085600 A1* | 3/2022 | Qi | ............................ | H02H 3/08 |
| 2022/0190582 A1* | 6/2022 | Strassel | .................. | H02H 3/025 |
| 2022/0263502 A1* | 8/2022 | Zhang | .................... | H01L 23/36 |
| 2023/0188134 A1* | 6/2023 | Song | ................. | H03K 17/6874 |
| | | | | 361/101 |

OTHER PUBLICATIONS

Kaisar Rachi MD Rifat et al., "Main Breaker Switching Control and Design Optimization for a Progressively Switched Hybrid DC Circuit Breaker", 2020 IEEE Energy Conversion Congress and Exposition (ECCE), p. 6016-6023; 8 pages.
Rahman Muhammad Foyazur et al., "Design of a Current Limiting Solid State Circuit Breaker (CL-SSCB) for DC Microgrids", 2023 IEEE Energy Conversion Congress and Exposition (ECCE), pp. 6470-6475; 6 pages.

* cited by examiner

500

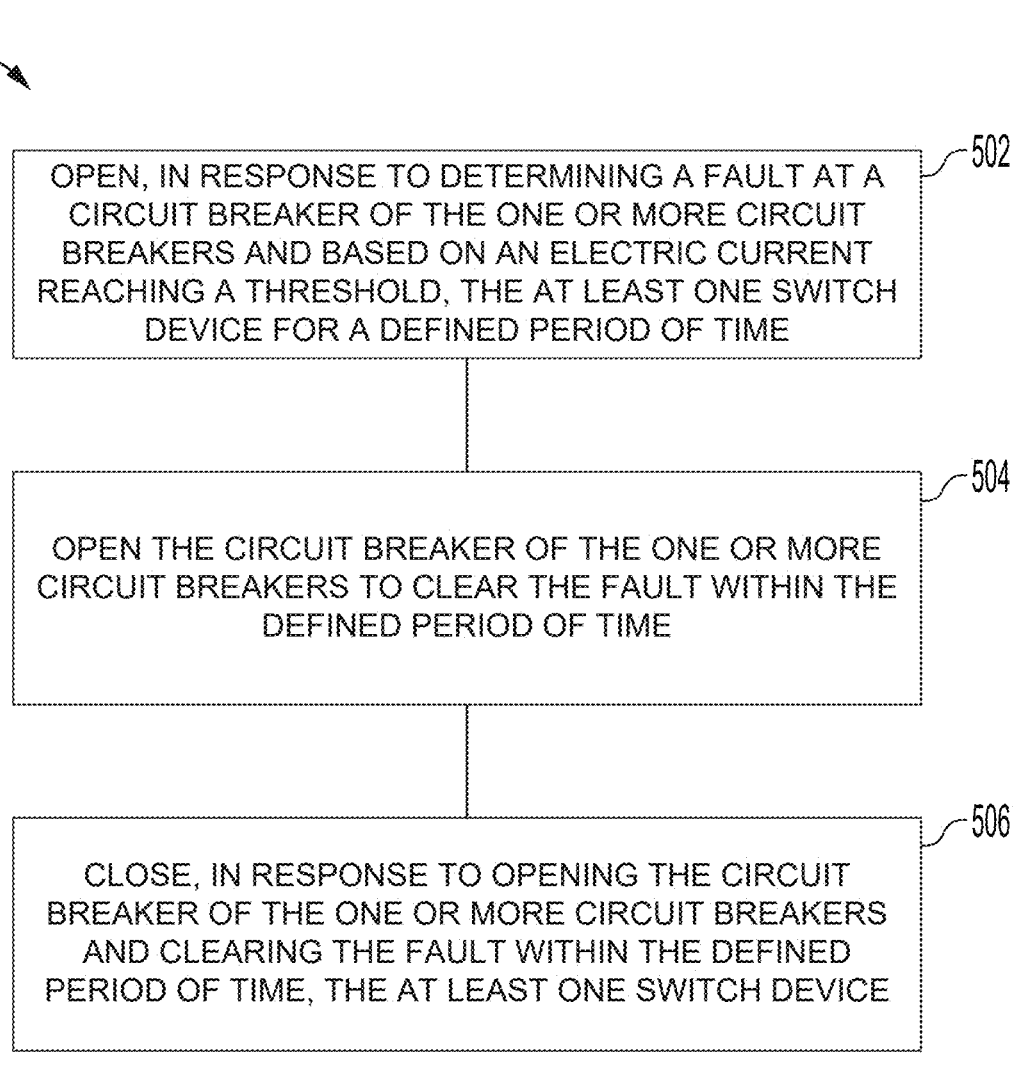

502

OPEN, IN RESPONSE TO DETERMINING A FAULT AT A CIRCUIT BREAKER OF THE ONE OR MORE CIRCUIT BREAKERS AND BASED ON AN ELECTRIC CURRENT REACHING A THRESHOLD, THE AT LEAST ONE SWITCH DEVICE FOR A DEFINED PERIOD OF TIME

504

OPEN THE CIRCUIT BREAKER OF THE ONE OR MORE CIRCUIT BREAKERS TO CLEAR THE FAULT WITHIN THE DEFINED PERIOD OF TIME

506

CLOSE, IN RESPONSE TO OPENING THE CIRCUIT BREAKER OF THE ONE OR MORE CIRCUIT BREAKERS AND CLEARING THE FAULT WITHIN THE DEFINED PERIOD OF TIME, THE AT LEAST ONE SWITCH DEVICE

OPEN, IN RESPONSE TO THE SWITCHING DEVICE OF THE
ONE OR MORE SWITCHING DEVICES FAILING TO
INTERRUPT THE ELECTRIC CURRENT WITHIN THE
DEFINED PERIOD OF TIME, AN OTHER OF THE FIRST
SWITCH AND THE SECOND SWITCH

702

900

FAULT CURRENT LIMITING SOLID-STATE SWITCHING DEVICE

FIELD

The present disclosure relates to the field of electrical circuits, and more particularly, to fault current limiting solid-state switching devices in electrical power circuits.

BACKGROUND

Electrical fault protection devices such as, for example, circuit breakers are designed to interrupt current to provide protection in power distribution systems. These circuit breakers safeguard against electrical fault events such as, for example, electrical shorts and/or overcurrent to protect connected equipment and people. Such systems can include electro-mechanical circuit breakers (EMCBs), solid-state circuit breakers (SSCBs), or both.

EMCBs are commonly utilized as fault protection devices in power systems due to their relatively lower costs compared to SSCBs. EMCBs typically operate over a timescale of 10 s of milliseconds. This speed of operation may be suitable in certain AC systems or for slow-rising fault currents in DC systems. However, the rate of rise of fault current can be significantly higher in DC systems than in AC systems. The rate of rise (di/dt) of the fault current can range from a few amperes per microsecond to several hundred amperes per microsecond (A/μs). In a short-circuit event, the fault current can therefore balloon to unmanageable levels over the time it takes the EMCB to open and interrupt the fault.

Alternatively, SSCBs typically have operating times in the order of a few microseconds, and thus they can interrupt fast-rising DC faults. In this regard, SSCBs are often utilized in power systems due to their ability to quickly switch open to interrupt electric current in response to an electric fault as compared to EMCBs. However, SSCBs are typically more expensive than EMCBs. Hence, many systems typically utilize a single upstream SSCB and multiple downstream EMCBs for protecting individual feeders. In systems having this or other similar configurations, the downstream CB is switched open to interrupt the electric fault to protect the connected electric load devices on the respective feeder line, or if it is determined that the downstream CB cannot switch open in time, the upstream SSCB is switched open to interrupt the electric fault current to protect the power system.

SUMMARY

In some embodiments, a device for providing fault current protection in a power circuit, the device includes a solid-state switching device (SSSD) including at least one switch device including a first semiconductor device, a voltage clamping circuit, the voltage clamping circuit is connected in parallel with the at least one switch device, and one or more circuit breakers, the one or more circuit breakers are connected in series with the SSSD. In some embodiments, in response to determining a fault at a circuit breaker of the one or more circuit breakers, selectively controlling an operation of the at least one switch device to maintain an electric current at a threshold for a defined period of time to enable clearing the fault at the circuit breaker.

In some embodiments, selectively controlling the operation of the at least one switch device to maintain the electric current at the threshold for the defined period of time includes opening, in response to the electric current reaching the threshold, the at least one switch device to commutate the electric current to the voltage clamping circuit and cause a voltage to increase across the at least one switch device, the fault at the circuit breaker is determined based on a measured electric current at the circuit breaker exceeding a second threshold.

In some embodiments, the voltage clamping circuit includes a fault current limiting level configured to maintain a voltage across the at least one switch device consistent with a voltage in the power circuit while commutating the electric current during the defined period of time.

In some embodiments, the at least one switch device further includes a second semiconductor device, and the voltage clamping circuit includes a varistor in parallel connection across the first semiconductor device and the second semiconductor device.

In some embodiments, the first semiconductor device and the second semiconductor device include metal-oxide-semiconductor field-effect transistors (MOSFETs), insulated-gate bipolar transistors (IGBTs), integrated gate-commutated thyristors (IGCTs), bipolar transistors, Darlington transistors, field effect transistors (FETs), silicon-controlled rectifiers (SCRs), thyristors, triacs, unijunction transistors, diodes, or any combinations thereof.

In some embodiments, the first semiconductor device is in anti-series connection with the second semiconductor device; and the first semiconductor device and the second semiconductor device include MOSFETs.

In some embodiments, the first semiconductor device is in anti-parallel connection with the second semiconductor device, and the first semiconductor device and the second semiconductor device comprise IGCTs.

In some embodiments, the at least one switch device includes a first switch device, and a second switch device. In some embodiments, controlling the operation of the at least one switch device to maintain the electric current at the threshold during the defined period of time further includes opening, in response to the electric current reaching the threshold, one of the first switch device or the second switch device to commutate the electric current to a respective voltage clamping circuit and cause a voltage to increase across the one of the first switch device or the second switch device, and opening, in response to failing to clear the fault at the circuit breaker within the defined period of time, an other of the first switch device and the second switch device to commutate the electric current to the respective voltage clamping circuit and interrupt the electric current at the SSSD. In some embodiments, the fault at the circuit breaker is determined based on a measured electric current at the circuit breaker exceeding a second threshold.

In some embodiments, the device further includes a controller. In some embodiments, the controller is configured to send gate command signals to the at least one switch device to selectively turn ON and OFF the at least one switch device using a single turn-off shot.

In some embodiments, the controller does not utilize pulse width modulation to control the operation of the at least one switch device.

In some embodiments, a system for providing electric current fault protection in a power circuit, the system includes a solid-state switching device (SSSD) including at least one switch device including a first semiconductor device, and a varistor in parallel connection with the at least one switch device, one or more circuit breakers, and, in response to determining a fault at a circuit breaker of the one or more circuit breakers, selectively controlling an operation of the at least one switch device to maintain an electric current at a fault current trip threshold for a defined period of time to enable clearing the fault at the circuit breaker. In some embodiments, the varistor includes a fault current limiting level configured to maintain a voltage across the at least one switch device consistent with a voltage in the power circuit while commutating the electric current during the defined period of time.

In some embodiments, selectively controlling the operation of the at least one switch device to maintain the electric current at the threshold during the defined period of time includes opening, in response to the electric current reaching the fault current trip threshold, the at least one switch device to commutate the electric current to the varistor and cause the voltage to increase across the at least one switch device. In some embodiments, the fault at the circuit breaker is determined based on a measured electric current at the circuit breaker exceeding a second threshold.

In some embodiments, the at least one switch device further includes a second semiconductor device, the first semiconductor device is in anti-series connection with the second semiconductor device. In some embodiments, the first semiconductor device and the second semiconductor device include MOSFETs.

In some embodiments, the at least one switch device further includes a second semiconductor device, the first semiconductor device is in anti-parallel connection with the second semiconductor device, the first semiconductor device and the second semiconductor device include IGCTs.

In some embodiments, the at least one switch device includes a first switch device, and a second switch device, and the varistor includes a first varistor in parallel connection with the first switch device and a second varistor in parallel connection with the second switch device.

In some embodiments, controlling the operation of the at least one switch device to maintain the electric current at the threshold during the defined period of time further includes opening, in response to the electric current reaching the fault current trip threshold, one of the first switch device or the second switch device to commutate the electric current to a respective one of the first varistor or the second varistor and cause a voltage to increase across the one of the first switch device or the second switch device, opening the circuit breaker of the one or more circuit breakers to clear the fault within the defined period of time, and closing, in response to opening the circuit breaker of the one or more circuit breakers, the one of the first switch device or the second switch device, the fault current trip threshold includes a level Ith such that Ith>Ithi, and Ith<Ith1, Ithi being the fault current trip threshold of the circuit breaker and Ith1 being the fault current trip threshold of the SSSD.

In some embodiments, controlling the operation of the at least one switch device to maintain the electric current at the fault current trip threshold during the defined period of time further includes opening, in response to failing to clear the fault within the defined period of time, an other of the first switch device and the second switch device to commutate the electric current to a respective first varistor or the second varistor to interrupt the electric current at the SSSD.

In some embodiments, the system further includes a controller, and the controller is configured to send gate command signals to the at least one switch device to selectively turn ON and OFF the at least one switch device using a single turn-off shot, the controller does not utilize pulse width modulation to control the operation of the at least one switch device.

In some embodiments, a method for providing fault protection in a power circuit, the power circuit including a solid-state switching device (SSSD) including at least one switch device and a varistor connected in parallel across the at least one switch device, the SSSD connected upstream of one or more circuit breakers, the method includes opening, by a controller in response to determining a fault at a circuit breaker of the one or more circuit breakers and based on an electric current reaching a threshold, the at least one switch device for a defined period of time to commutate the electric current to the varistor and cause a voltage across the at least one switch device to increase, opening, by the controller, the circuit breaker of the one or more circuit breakers to clear the fault within the defined period of time, and closing, by the controller in response to opening the circuit breaker of the one or more circuit breakers and clearing the fault within the defined period of time, the at least one switch device. In some embodiments, the controller is configured to send gate command signals to the at least one switch device to selectively turn ON and OFF the at least one switch device using a single turn-off shot, and the controller does not utilize pulse width modulation to control an operation of the at least one switch device.

In some embodiments, the at least one switch device includes a first switch device located on a first pole and a second switch device located on a second pole, and opening the at least one switch device for the defined period of time includes opening one of the first switch device or the second switch device for the defined period of time, and the method further includes opening, by the controller in response failing to clear the fault within the defined period of time, an other of the first switch device and the second switch device to commutate the electric current to the varistor connected in parallel to the other of the first switch device and the second switch device to interrupt the electric current at the SSSD.

BRIEF DESCRIPTION OF THE DRAWINGS

Some embodiments of the disclosure are herein described, by way of example only, with reference to the accompanying drawings. With specific reference now to the drawings in detail, it is stressed that the embodiments shown are by way of example and for purposes of illustrative discussion of embodiments of the disclosure. In this regard, the description taken with the drawings makes apparent to those skilled in the art how embodiments of the disclosure may be practiced.

FIG. 8 is a flow diagram illustrating a method, according to some embodiments.

DETAILED DESCRIPTION

Figure 1:
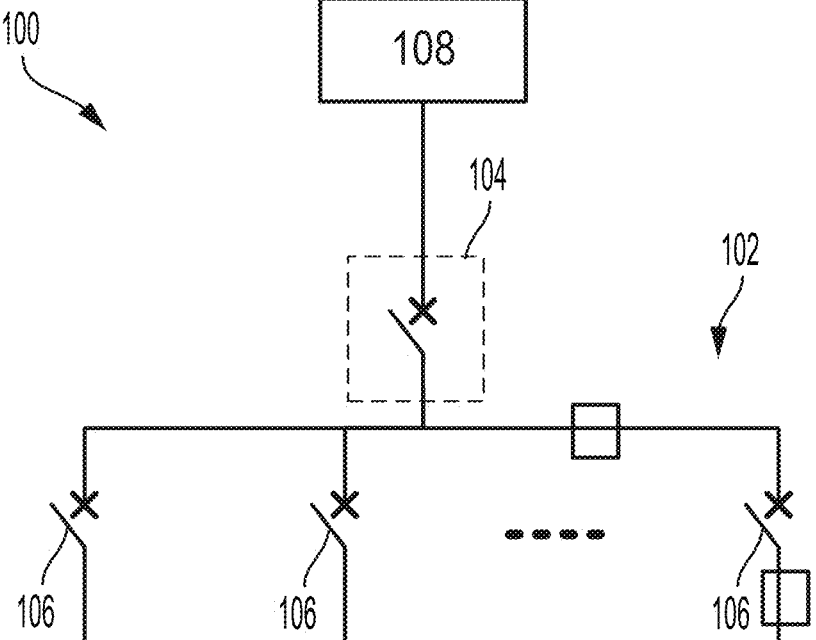
FIG. 1 is a schematical diagram illustrating a system, according to some embodiments.

Various embodiments of the present disclosure relate to systems, devices, assemblies, and methods for providing fault current limiting protection in a power distribution system such as, for example, a DC power circuit, DC microgrid, etc., and maintaining breaker coordination between upstream and downstream circuit breakers (CBs) without necessitating an additional fault-current limiting circuit. According to some embodiments, a system for providing the fault current limiting protection in a DC power circuit may include an upstream CB in electrical connection with one or more other downstream CBs. The system described herein is employed in a DC power circuit but may also be suitable for other power circuits such as, for example, AC power circuits. According to some embodiments, the upstream CB may be referred to herein as a solid-state switching device (SSSD) or a solid-state circuit breaker (SSCB). In addition, each of the downstream CBs may be referred to as an electro-mechanical circuit breaker (EMCB). In some embodiments, the downstream CB may also be a SSSD, having therein one or more semiconductor devices and being capable of fast switching operation to interrupt the electric current in the power line. In some embodiments, the downstream CBs may be a similar device to the upstream CB.

Generally, the upstream CB is configured to switch between open and closed states to direct electric current through the upstream CB and between the electric load and the downstream circuit breakers. According to some embodiments, the upstream CB may include one or more switch devices, and the upstream CB may be configured to selectively operate the switch device(s) to provide current limiting protection to the DC power circuit in case of detecting an electric fault at one of the downstream CBs, that is, the upstream CB may be configured to selectively operate the switch device or devices in the upstream CB to limit the electric fault current to a certain level for a pre-defined period of time to enable the downstream CB (e.g., EMCB or SSSD) to open and protect the electrical load devices connected on the respective feeder from the fault. In addition, each switch device may include one or more turn-off power semiconductor devices for interrupting the electrical current, as will be further described herein. The upstream CB, and the switch devices therein, may be configured to provide uni-directional or bi-directional control of electric current in the system, as will be further described herein.

According to some embodiments, the upstream CBs can include one or more switching devices therein configured to be selectively turned on and off to provide improved current limiting capabilities over the known prior art, as will be further described herein. In response to determining an electric fault condition exists at one of the downstream CBs, the at least one switch device in the upstream CB may be selectively controlled to provide the downstream CB a pre-defined period of time to switch open and interrupt the electric fault current at the downstream CB rather than having to interrupt the electric current at the upstream CB, thereby limiting loss of protection coordination in the system between the upstream and downstream CBs, and causing all the downstream feeders to lose power even though the fault may have occurred in only one of the downstream feeders.

By selectively operating the switch device or devices in the upstream CB to commutate the electric current to a corresponding voltage limiting circuit for a pre-defined period of time, the upstream CB may provide the current limiting functionality in response to fast-rising downstream fault currents, which is an improvement over conventional systems known in the prior art where both the upstream and downstream CBs would trip due to loss of breaker coordination. In this regard, the maximum fault di/dt at which the system can successfully maintain coordination is also improved.

According to some embodiments, the DC power circuit may include positive, negative, and ground poles, and the one or more switch devices of the upstream CB may be located on one or more of the poles of the DC power circuit. The upstream CB may include the one or more switch devices on each pole of the DC power circuit. In some embodiments, the upstream CB may include the one or more switch devices on one pole of the DC power circuit. In other embodiments, the upstream CB may include the one or more switch devices on each of the first and second poles of the DC power circuit. For example, the positive and negative poles may each include the one or more switch devices on respective poles, and the switch devices on the positive pole may provide fault current limiting protection in instances when there is a positive-ground electric fault. In other embodiments, the upstream CB may include one or more switch devices on all three poles (e.g., positive, negative, and ground). According to some embodiments, each switch device may be a two-quadrant switch device. In other embodiments, the switch device may be a four-quadrant switch (FQS).

For a given pole, the upstream CB may include one or more switch devices. Each switch device is capable of switching between open and close states to control directing electric current across the switch device. According to some embodiments, on a given pole of the DC power circuit, the upstream CB may include one switch device. The one switch device may be turned on to direct electric current through the switch device and turned off to limit the electric current at a fault current threshold by commutating the electric current to a voltage limiting circuit, as will be further described herein.

According to some embodiments, on a given pole of the DC power circuit, the upstream CB may include at least two switch devices. The at least two switch devices may be series-connected, that is, the switch devices may be in series electrical connection with each other and the downstream CBs on the given pole. In some embodiments, the at least two switch devices may include a first switch device and a second switch device. In normal operation, the at least two switch devices may be in the closed state to direct electric current through the upstream CB. In response to detecting a fault downstream of the CB, one of the first switch device and second switch device may be switched from the closed state to an open state to limit the electric current directed through the upstream CB. By opening the respective switch device, the voltage is commutated to the voltage limiting circuit. After a pre-defined period of time, and in response to the downstream CB failing to clear the fault, the other of the first switch device and second switch device may be switched from the closed state to the open state to reduce the electric current to zero at the upstream CB by commutating the voltage to the voltage limiting circuit. In some embodiments, the upstream CB may include at least two switch devices including, for example, a first switch device and a second switch device located on the pole to provide bi-directional control of electric current.

Each switch device may include one or more semiconductor devices. The operation of the semiconductor devices may be selectively controlled such that the semiconductor devices switch open and closed to conduct or direct the electric current directed through the semiconductor device, respectively, and to direct the electric current through the switch device. The configuration or arrangement of the semiconductor devices included in each switch device may be determined based on the type of semiconductor device. In addition, the configuration and arrangement of the semiconductor devices included in each switch device may be based on whether the upstream CB is configured for uni-directional or bi-directional current control. In some embodiments, the switch device may include a first semiconductor switch device in anti-series connection with a second semiconductor switch device. In other embodiments, the switch device may include a first semiconductor switch device in anti-parallel with a second semiconductor switch device. According to some embodiments, the upstream CB may be a true FQS device connected in series between an electrical load and downstream CBs, the FQS device being configured to conduct current in both directions and to block voltage at both polarities.

According to some embodiments, the upstream CB may include a voltage limiting circuit connected in parallel across each switch device. In some embodiments, the voltage limiting circuit may include a varistor that is selected to include a fault current limiting level suitable for a DC voltage level of the system. For example, the varistor may be a metal-oxide-varistor (MOV). In this regard, the varistor is configured to commutate the electric current in response to the switch device switching to the open state. By commutating the electric current to the varistor, a voltage across the varistor during commutation is maintained at a level substantially similar to a voltage in the rest of the power circuit, and thereby enabling the fault current limiting protection in the upstream CB.

According to some embodiments, the upstream CB may be a SSSD configured to provide the fault current limiting protection by triggering the switch device(s), and the corresponding semiconductor devices therein, using a single turn-off shot. In this regard, it is to be appreciated by those having ordinary skill in the art that the upstream CB does not provide fault current limiting protection by triggering the switch device(s), or the corresponding semiconductor devices therein, using pulsing control on the semiconductor devices (e.g., pulse width modulation). The system therefore provides improved current limiting protection over the known prior art that utilizes a separate fault current trip circuit to implement pulsing control to rapidly switch the semiconductor devices in the upstream CB open and closed to maintain the electric fault current within a certain level until the downstream CB can switch open. In this regard, these conventional systems include upstream CBs having semiconductor device topologies configured to be consistently tripped on and off to keep the electric current at a constant peak fault-current level, within the limits set by the trip circuit. These conventional di/dt compensators operate by artificially reducing the trip threshold so that the SSCB still trips at a peak fault current over the operational range of the di/dt compensator.

According to some embodiments, the system may include a controller. The controller may be configured to, based on obtaining electric current measurements measured by one or more sensor devices, control an operation of the upstream CB. In some embodiments, the controller may be in connection with the upstream CB and each of the downstream CBs to control operation of the upstream CB and the downstream CBs, respectively. In other embodiments, each of the upstream CB and each of the downstream CBs may have a local controller associated therewith for controlling an operation of the respective devices. As such, in some embodiments, the system may include a master controller that controls the local controllers of each of the devices. The local controllers may be configured to monitor parameters at each respective device on the power line such as, for example, an electric current measured at a local sensor device, and each controller may also be in electronic communication with one or more other local controllers to enable performing the fault current limiting protection in accordance with the present disclosure.

The controller may be in electrical connection with the semiconductor devices in the SSCB to control an operation of the respective semiconductor device to switch between an OFF state and ON state by sending corresponding gate signals to the respective semiconductor device. In some embodiments, each CB may include a controller associated therewith, or a group of CBs in the system may include a respective controller associated therewith, and the controller associated with the upstream CB may coordinate the operation of the other CBs to provide the fault current limiting protection in the system. In other embodiments, the system may include a controller in electrical communication with the local controller(s) associated with the CBs to perform the fault current limiting protection in accordance with the present disclosure.

According to some embodiments, to provide the fault current limiting protection in the system, the electric current (i.e., fault current) may be limited to a particular threshold level $I_{th}$ such that $I_{th} > I_{thi}$, and $I_{th} < I_{th1}$, where $I_{thi}$ is the fault current trip threshold of the i-th CB (i.e., downstream CB) and where $I_{th1}$ is the fault current trip threshold of the upstream CB. The fault current may be held at $I_{th}$ by the upstream CB for a pre-set amount of time (defined period of time) to give the downstream CB enough time to trip and clear the fault current. In this regard, proper breaker coordination between the upstream and downstream CBs is maintained, and thus the reliability of the DC power system is improved.

The upstream CB may be configured to primarily provide the fault current limiting protection in the system. That is, the upstream CB may be designed to handle the fault current limiting over the defined period of time, which is designed to allow the respective downstream CB adequate time to trip open in response to the electric current at the respective downstream CB exceeding the fault current trip threshold. In some embodiments, the fault current limiting protection may be initiated at the upstream CB by the controller based on the electric fault current reaching a certain threshold current level. In other embodiments, the fault current limiting protection may be initiated at the upstream CB by the controller based on the rate of rise, di/dt, of the electric fault current reaching a certain rate of rise limit threshold.

According to some embodiments, based on detecting the electric fault at any one of the downstream CBs, the controller may perform operations including, in response to the electric current at one of the downstream CBs exceeding the fault current threshold, opening the switch device to commutate the electric current to the associated varistor and cause a voltage across that switch device (and varistor) to increase. The varistor is configured to maintain the voltage at a level substantially similar to a voltage in the rest of the DC power circuit (e.g., operating voltage). In addition, the controller may, in response to the downstream CB failing to interrupt the electric fault current within a defined period of time, open an other switch device in the upstream CB such that the electric current commutates to that associated varistor to cause the electric current to effectively reduce to 0 Amps (A) and block the current directed through the upstream CB. According to some embodiments, the controller may also control an operation of the downstream CBs including opening the downstream CB in response to detecting an electric fault to interrupt the electric current at the downstream feeder, and closing the downstream CB in response to determining the electric fault has cleared to direct the electric current to the downstream feeder.

It is to be appreciated by those having ordinary skill in the art that the topologies of the upstream CB described herein, and shown in the corresponding figures, are exemplary and not intended to be limiting. That is, the upstream CB may include the topologies described herein, or may be implemented using one or more other topologies including therein one or more different types of semiconductor devices, such that the upstream SSCB is capable of performing the fault current limiting protection in accordance with the present disclosure and which will be further described herein.

Among those benefits and improvements that have been disclosed, other objects and advantages of this disclosure will become apparent from the following description taken in conjunction with the accompanying figures. Detailed embodiments of the present disclosure are disclosed herein; however, it is to be understood that the disclosed embodiments are merely illustrative of the disclosure that may be embodied in various forms. In addition, each of the examples given regarding the various embodiments of the disclosure which are intended to be illustrative, and not restrictive.

FIG. 1 is a schematical diagram illustrating a system 100, according to some embodiments.

System 100 is configured to provide fault current protection in a DC power circuit 102 such as, for example, a DC microgrid. In this regard, the system 100 includes a high-speed, high-bandwidth control circuit that processes current and voltage information, detects short-circuit events, and provides digital commands to respective gate drive units at certain intervals for performing the fault current limiting function in accordance with the present disclosure.

The system 100 includes a solid-state switching device (SSSD) 104. The SSSD 104 is an upstream CB in electrical connection with one or more circuit breakers 106 downstream of SSSD 104. The SSSD 104 may be connected in series with the one or more circuit breakers 106. In some embodiments, the SSSD 104 may be connected in series between the circuit breakers 106 and power source 108.

According to some embodiments, system 100 may include a plurality of circuit breakers 106 in electrical connection with SSSD 104. The SSSD 104 may be connected in series with the plurality of circuit breakers 106, and the circuit breakers 106 may be connected in parallel with the other circuit breakers 106 in the DC power circuit 102. In addition, although not shown, the circuit breakers 106 may be in electrical connection with one or more electrical devices on the respective feeder and the circuit breakers 106 may be configured to provide electrical fault current protection to the connected one or more electrical devices. In this regard, in response to detecting an electrical fault at a circuit breaker 106 of the one or more circuit breakers 106, the respective circuit breaker 106 is configured to trip open and interrupt the electrical current to protect the connected electrical devices from the fault. The circuit breakers 106 may be an electro-mechanical circuit breaker (EMCB), according to some embodiments. In other embodiments, the circuit breakers 106 may also be a SSSD such as, for example, the SSSD 104 and including therein one or more semiconductor devices capable of fast switching operations for providing electric fault protection to the electrical load devices connected to the feeder on DC power circuit 102 and system 100. It is to be appreciated by those having ordinary skill in the art that the type of downstream circuit breakers described herein are exemplary and not intended to be limiting and may include any of a plurality of different type of fault current protection devices capable of performing switching operations to electrically interrupt the fault current, in accordance with the present disclosure.

The SSSD 104 is a solid-state switching device capable of fast switching operations to interrupt the electrical current in DC power circuit 102, that is, the SSSD 104 may be capable of interrupting the electrical current between the power source 108 and the one or more circuit breakers 106, according to some embodiments. The SSSD 104 may also be referred to as a solid-state circuit breaker (SSCB) 104. The SSSD 104 may be configured to provide uni-directional or bi-directional fault current limiting, as will be further described herein.

The SSSD 104 provides fault current limiting protection to the DC power circuit 102 by, in response to detecting a fault in the DC power circuit 102, performing operations to maintain the electric current at a certain fault current threshold for a pre-set or pre-defined period of time to enable the respective downstream circuit breaker 106 adequate time to trip open and protect the downstream electrical devices in electrical connection with the feeder from the fault. In this regard, by the SSSD 104 not tripping open for the defined period of time such that the downstream circuit breaker(s) 106 affected by the electric fault have an opportunity to switch open, the current limiting function of the SSSD 104 maintains breaker coordination between SSSD 104 and the downstream circuit breakers 106 so that SSSD 104 does not have to interrupt electric power delivery to the other circuit breakers 106 in the DC power circuit 102, and the other electrical systems or devices in electrical connection with DC power circuit 102 at the respective feeders when the electric fault current reaches a certain threshold.

It is to be appreciated that the system 100 can also include, although not shown in the figures, one or more sensor devices for detecting voltage, electric current, other electrical characteristics, or any combinations thereof, across the DC power circuit 102 and to enable the one or more components of the system 100 to perform the operations in accordance with the present disclosure. For example, the system 100 may include a current sensor on a respective feeder line adjacent circuit breakers 106, between SSSD 104 and circuit breakers 106, between SSSD 104 and power source 108, in SSSD 104, in any of the circuit breakers 106, and at any of a plurality of other locations in the DC power circuit 102 to enable the system 100 to detect the electric current in the DC power circuit 102, to determine a fault is occurring in the DC power circuit 102, to determine that the circuit breakers 106 have opened to interrupt the fault, and to perform any other operations in accordance with the present disclosure.

Figure 2:
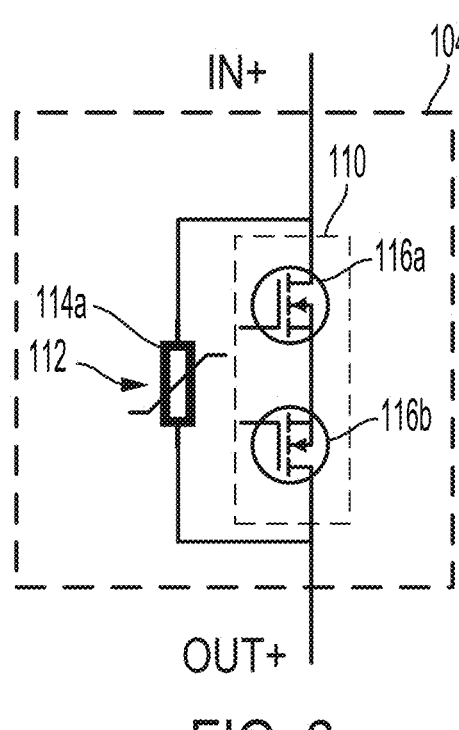
FIG. 2 is a schematical diagram illustrating a non-limiting example of the SSSD, according to some embodiments.

FIG. 2 is a schematical diagram illustrating a non-limiting example of the SSSD 104 in FIG. 1, according to some embodiments. The SSSD 104 may be located on a pole and include at least one switch device 110. The switch device 110 may be capable of conducting current in both directions and may also be capable of blocking voltages of both polarities. In this regard, the switch device 110 serves as a four-quadrant switch (FQS) device. The SSSD 104 and the switch device 110 may be in series connection with the downstream circuit breakers 106. In addition, the SSSD 104 and the switch device 110 may be in series connection between the circuit breakers 106 and the power source 108, in some embodiments.

The switch device 110 includes one or more semiconductor devices 116 therein. The semiconductor devices 116 may be selectively controlled open and closed using gate control signals to control the electric current and voltage directed through the switch device 110. Referring to FIG. 2, the switch device 110 includes semiconductor device 116 *a* in anti-series connection with semiconductor device 116 *b* on a given pole. In addition, the SSSD 104 includes a voltage clamping circuit 112 in parallel connection with the switch device 110 across both the semiconductor device 116 *a* and semiconductor device 116 *b*.

To open the switch device 110 such as, for example, when an electric fault is detected at any of the downstream circuit breakers 106, gate control signals may be sent to the semiconductor device 116 *a* and semiconductor device 116 *b* to switch open the switch device 110. As the switch device 110 opens, the electric current gets commutated into voltage clamping circuit 112 that is connected in parallel to switch device 110, leading to a voltage rise across the terminals of the switch device 110 as per the voltage clamping circuit 112 I-V characteristics. The components of the voltage clamping circuit 112 may be selected such that the voltage rise across the terminals is substantially equal to the voltage for the DC power circuit 102. By doing so, the SSSD 104 can remain in this state so long as the energy dissipated by the voltage clamping circuit 112 stays under the thermal limit for the components (e.g., varistor 114) selected in the design, which may define, at least in part, the period of time that the SSSD 104 remains open to allow the downstream circuit breakers 106 to switch open during electric fault events.

The DC power circuit 102 may include one or more poles. In addition, the SSSD 104 may include at least one switch device 110 on one or more of the poles of the DC power circuit 102. For example, the DC power circuit 102 may include a first pole (positive), second pole (negative), and third pole (ground), and the SSSD 104 may include the at least one switch device 110 located on each of the first pole and second pole. In some embodiments, the SSSD 104 includes the at least one switch device 110 on one pole. For example, the positive pole may include a first switch device 110 and a second switch device 110. In other embodiments, the SSSD 104 includes the at least one switch devices 110 on two poles. For example, the positive pole and the negative pole may each include a first switch device 110 and a second switch device 110. In this regard, having the at least one switch device 110 on two poles enables the system 100 to provide current limiting protection when there is a fault between the third pole and one of the two poles that include the at least one switch device 110. For example, if the positive and negative poles each include the at least one switch device 110, current limiting protection can still be provided for an electric fault between the positive and ground poles.

Figure 3:
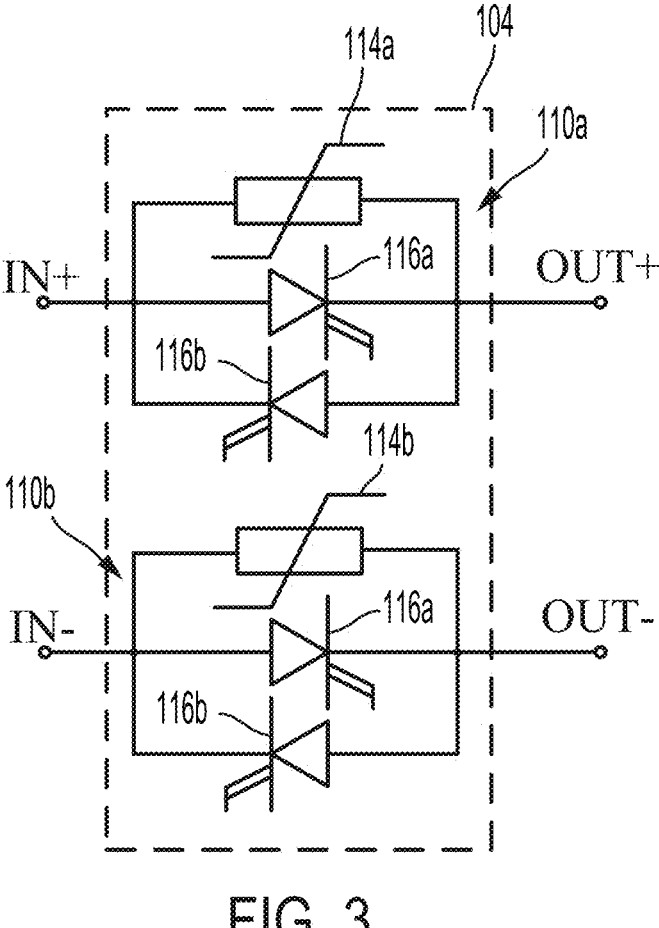
FIG. 3 is a schematical diagram illustrating another non-limiting example of the SSSD, according to some embodiments.

FIG. 3 is a schematical diagram illustrating another non-limiting example of the SSSD 104 in FIG. 1, according to some embodiments. The SSSD 104 may, according to some embodiments, be a two pole CB and include at least one switch device 110 located on each pole capable of providing bi-directional current limiting. In addition, the switch device 110 on a respective pole may be operated in tandem with the other switch device 110 on the other pole to provide the fault current limiting protection in accordance with the present disclosure.

Referring to FIG. 3, SSSD 104 includes switch device 110*a* located on a positive pole and switch device 110 *b* located on a negative pole. Switch device 110 *a* includes semiconductor device 116 *a* and semiconductor device 116 *b* connected in an anti-parallel arrangement, and varistor 114 *a* connected in parallel with the semiconductor device 116 *a* and semiconductor device 116 *b*. Switch device 110 *b* also includes semiconductor device 116 *a* and semiconductor device 116 *b* connected in anti-parallel arrangement, and varistor 114 *b* connected in parallel with the semiconductor device 116 *a* and semiconductor device 116 *b*. In some embodiments, the SSSD 104 may also include a switch device 110 on the ground pole, the switch device 110 on the ground pole may be similar to switch device 110 *a* and switch device 110*b*.

To open and close the SSSD 104 to control electric current being directed through SSSD 104, the switch device 110 *a* or switch device 110*b* may be selectively turned off and on. In the case of a fault being detected at one of the downstream circuit breakers 106, the switch device 110*a* or switch device 110*b* may be selectively operated to commutate the electric current to the varistor 114*a* or varistor 114*b* to maintain the voltage across the SSSD 104 on the pole at a level substantially equal to the voltage in the DC power circuit 102.

According to some embodiments, the system 100 may include, for example, the SSSD 104 shown in FIG. 3 to provide current limiting capabilities, as is described herein, in the DC power circuit 102 for the pre-defined period of time to provide the downstream CB with adequate turn off time. In addition, according to some embodiments, the system 100 may include, for example, another SSSD 104 as shown in FIG. 3 connected in series with the first SSSD 104 in the DC power circuit 102 to provide the DC power circuit 102 with current interruption capabilities, that is, in response to the downstream CB failing to open within the pre-defined period of time, the second SSSD 104 connected in series with the first SSSD 104 may also be turned off (e.g., opened) to commutate the electric current to the corresponding varistor 114 and interrupt the electric power being delivered from the power source 108 to the downstream electrical load devices. In some embodiments, the first SSSD 104 and second SSSD 104 may be combined into a single device and including therein at least two switch device 110 on each pole connected in series.

Figure 4:
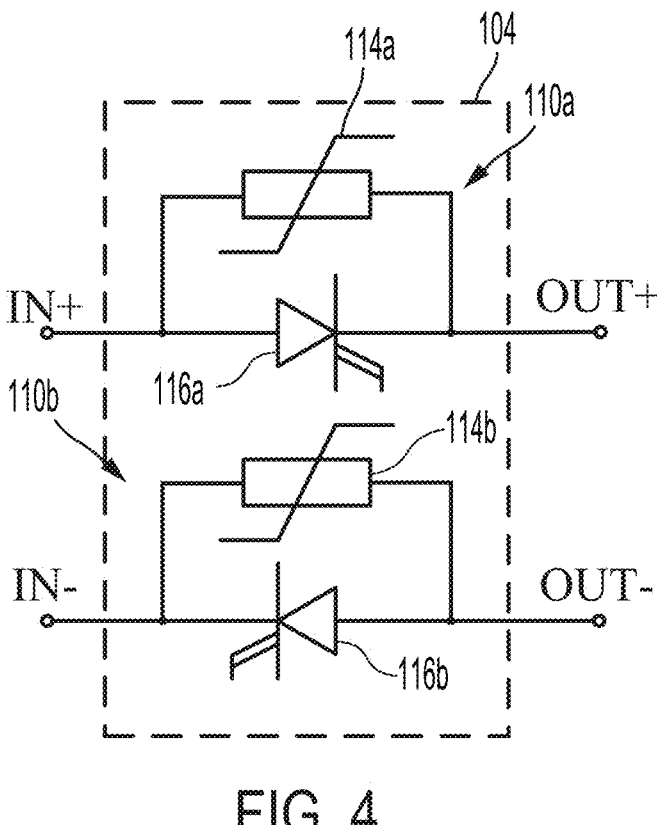
FIG. 4 is a schematical diagram illustrating another non-limiting example of the SSSD, according to some embodiments.

FIG. 4 is a schematical diagram illustrating another non-limiting example of the SSSD 104 in FIG. 1, according to some embodiments. The SSSD 104 may, according to some embodiments, be a two-pole CB, each pole including one or more switch devices located thereon capable of providing uni-directional current limiting. That is, each of the switch device 110*a* and switch device 110*b* may conduct electric current in one direction and block voltages of both polarities.

For example, the SSSD 104 as shown in FIG. 4 may be utilized in a power circuit of an electric vehicle charging system as the system is configured for uni-directional flow of electric current directed from the grid power source to the electric vehicle.

Referring to FIG. 4, the SSSD 104 may, according to some embodiments, be a two pole CB, each pole including at least once switch device 110. The switch device 110 on one pole may be operated in tandem with the other switch device 110 on the other pole to provide the fault current limiting protection in accordance with the present disclosure.

The SSSD 104, as shown in FIG. 4, includes switch device 110a located on a positive pole and switch device 110b located on a negative pole. In some embodiments, the SSSD 104 may also include a switch device 110 on the ground pole. Switch device 110a includes semiconductor device 116 a and varistor 114a connected in parallel with the semiconductor device 116 a. Switch device 110b includes semiconductor device 116 b and varistor 114b connected in parallel with the semiconductor device 116 b. To open and close the SSSD 104 to control electric current being directed through SSSD 104, the switch device 110a and switch device 110b may be simultaneously turned off and on, respectively. In the case of a fault being detected at one of the downstream circuit breakers 106, the switch device 110a may be selectively operated in tandem with switch device 110b to interrupt the electric current and to maintain the voltage across the SSSD 104 at a level substantially equal to the voltage in the DC power circuit 102. For example, referring to FIG. 4, when the electric fault is between the positive and negative poles, the switch device 110a and switch device 110b may both be opened to commutate the electric current to the respective varistor 114a and varistor 114b to provide the electric current limiting capabilities for the pre-defined period of time based on the I-V characteristics of the selected varistor 114.

According to some embodiments, the system 100 may include, for example, a first SSSD 104 as shown in FIG. 4 to provide the DC power circuit 102 with current limiting protection capabilities. In addition, in some embodiments, the system 100 may include, for example, a second SSSD 104 as shown in FIG. 4 to provide the DC power circuit 102 with current interruption capabilities to interrupt the electric current between the power source 108 and the downstream electrical load devices in response to the downstream CB failing to open during the pre-defined period of time when there is an electric current fault event at the downstream CB. In some embodiments, the first SSSD 104 and second SSSD 104 may be combined into a single device and including therein at least two switch device 110 on each pole connected in series.

Figure 5:
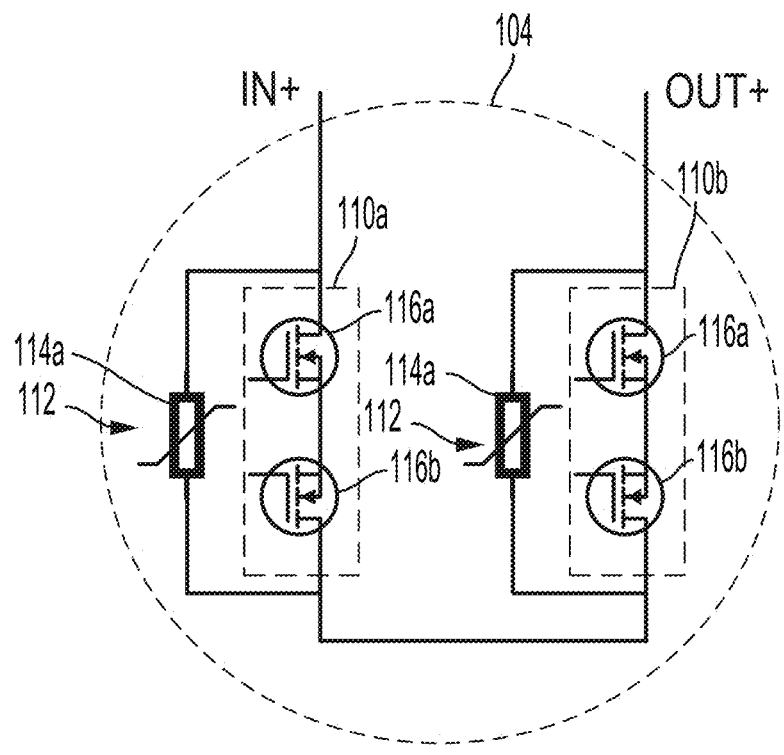
FIG. 5 is a schematical diagram illustrating another non-limiting example of the SSSD, according to some embodiments.

FIG. 5 is a schematical diagram illustrating another non-limiting example of the SSSD 104, according to some embodiments. The SSSD 104 may include at least two switch devices 110 located on a pole of DC power circuit 102, according to some embodiments. That is, referring to FIG. 5, the SSSD 104 may include switch device 110a and switch device 110b connected in series on a single pole. In some embodiments, SSSD 104 may be a two pole CB, each pole including the at least two switch devices 110 as shown in FIG. 5, and which may be operated in tandem to provide the DC power circuit 102 with electric fault current limiting capabilities to provide the downstream CB with time to turn off within the pre-defined period of time should the fault current reach a certain threshold and to provide current interruption capabilities if the downstream CB does not turn off or open within the pre-defined period of time.

Each switch device 110 may include one or more semiconductor device 116 that may be selectively controlled using corresponding gate control signals to switch open and closed each switch device 110. According to some embodiments, each switch device 110 includes semiconductor device 116 a and semiconductor device 116 b, which may hereinafter be collectively referred to as semiconductor devices 116.

According to some embodiments, the switch device 110 in the SSSD 104 may include one or more different types of semiconductor devices 116 therein. The topology of the switch device 110 and the configuration and arrangement of the semiconductor devices 116 in the switch device 110 may depend on the type of semiconductor device 116 utilized in the switch device 110. According to some embodiments, the semiconductor device 116 may include metal-oxide-semiconductor field-effect transistors (MOSFETs), insulated-gate bipolar transistors (IGBTs), integrated gate-commutated thyristors (IGCTs), bipolar transistors, Darlington transistors, field effect transistors (FETs), silicon-controlled rectifiers (SCRs), thyristors, triacs, unijunction transistors, diodes, other semiconductor devices, or any combinations thereof. For example, the switch device 110 may include a first RB-IGCT and a second RB-IGCT in an anti-parallel arrangement.

According to some embodiments, the semiconductor devices 116 in the switch device 110 may be, for example, MOSFETs, IGBTs, or other similar types of semiconductor devices, arranged in anti-series connection with the other semiconductor device(s) in the switch device 110. In other embodiments, the semiconductor devices 116 may be, for example, RB-IGCTs, GTOs, or other similar type of semiconductor devices, arranged in anti-parallel connection with the other semiconductor device(s) in the switch device 110.

In the exemplary embodiment of SSSD 104 shown in FIG. 5, the SSSD 104 including switch device 110a and switch device 110b connected in series with each other. Each switch device 110 includes semiconductor device 116 a and semiconductor device 116 b. The semiconductor devices 116 are MOSFETs in anti-series connection with each other in the respective switch device 110. Although FIG. 5 shows the semiconductor devices 116 in switch device 110 in anti-series connection, it is to be appreciated by those having ordinary skill in the art that this configuration of switch device 110 is exemplary and not intended to be limiting, and that the configuration of the semiconductor device 116 in switch device 110 may differ depending on the types of semiconductor devices being utilized in the switch device 110, as will be further described herein. In this regard, the switch device 110 in system 100 may include a plurality of different topologies and include therein a plurality of different types of semiconductor devices so long as the switch device 110 can be operated to switch open and closed to interrupt electric current across the respective switch device 110 to perform the current limiting protection in accordance with the present disclosure.

The system 100 and SSSD 104 also includes a voltage clamping circuit 112. In some embodiments, the SSSD 104 may include a voltage clamping circuit 112 in parallel connection with each switch device 110. In some embodiments, the voltage clamping circuit 112 may include a varistor 114 in parallel connection with the switch device 110 to commutate the electric current at the respective switch device 110. The voltage clamping circuit 112 may include therein one or more components for commutating the electric current to the voltage clamping circuit 112 to enable providing the current limiting protection. The one or more components in the voltage clamping circuit 112 may include, but is not limited to, varistors, transient voltage suppressing diodes, resistors, capacitors, other electrical components, or any combinations thereof. In some embodiments, the varistor 114 may be a metal-oxide varistor (MOV).

The SSSD 104 as shown in FIG. 5 includes the voltage clamping circuit 112. The voltage clamping circuit 112 including varistor 114a in parallel connection with switch device 110a, and varistor 114b in parallel connection with switch device 110b. The varistor 114a and varistor 114b may hereinafter be collectively referred to as varistors 114. In SSSD 104, each of the switch devices 110 include semiconductor device 116 a and semiconductor device 116 b, and the varistors 114 are in parallel connection across the semiconductor device 116 a and semiconductor device 116 b of the respective switch device 110. It is to be appreciated by those having ordinary skill in the art that the voltage clamping circuit 112 as shown in FIG. 5 is exemplary and is not intended to be limiting. Therefore, the voltage clamping circuit 112 may include one or more components for commutating the electric current across the switch device 110 in accordance with the present disclosure.

When the SSSD 104 is commanded to close or open such as, for example, during normal operation, the switch device 110a and switch device 110b may both open and close simultaneously and therefore the SSSD 104 behaves like a single switch. However, in case of a fault event such as, for example, a short-circuit event at any of the downstream circuit breakers 106, the SSSD 104 may be operated to provide the current limiting protection to allow the downstream circuit breakers 106 time to switch open to prevent loss of breaker coordination. In this regard, when the fault current event is determined to be occurring such as, for example, when the rate of rise of the fault current exceeds a defined rate of rise limit, one of the switch devices 110, e.g., one of switch device 110a and switch device 110b, may be switched open to maintain the fault current at a certain fault current threshold. That is, in response to detecting the fault determined based on the fault current, one of the switch devices 110 in the SSSD 104 is configured to switch open to interrupt the electric current at the SSSD 104. For example, in some embodiments, the switch device 110 is opened to interrupt the electric current across the switch device 110 by simultaneously switching open the semiconductor devices 116 in the respective switch device 110.

When the switch devices 110 opens, the current then gets commutated into the corresponding varistor 114 that is connected in parallel across that switch device 110, leading to a voltage rise across the switch device's 110 terminals according to the I-V characteristics of the voltage clamping circuit 112 or varistor 114. That is, the voltage clamping circuit 112 and the selected varistor 114 includes a fault current limiting level configured to maintain the voltage across the switch device 110 consistent with the voltage in the DC power circuit 102 while commutating the electric current during the defined period of time. That is, the period of time that the one of the switch device 110 in the SSSD 104 remains switched open to maintain the voltage across the switch device 110 consistent with the voltage in the DC power circuit 102 is dependent on the characteristics of the voltage clamping circuit 112.

The one of the switch device 110 is switched open for the defined period of time and maintains the voltage across the switch device 110 consistent with the voltage of the DC power circuit 102 to allow the affected downstream circuit breakers 106 time to switch open and interrupt the electric fault current at the respective feeder line and protect the connected electrical load devices. Once the downstream circuit breakers 106 has switched open, the SSSD 104 may return to a normal condition by closing the switch device 110 that had opened to provide the fault current limiting protection.

However, if the downstream circuit breaker 106 does not interrupt the fault within the defined time period (e.g., maximum current limiting interval), the SSSD 104 (or the controller associated with performing the fault current limiting protection) then assumes that the circuit breaker 106 has failed to open, the fault is occurring between SSSD 104 and circuit breakers 106, or the fault has occurred on the DC distribution bus. In response, the SSSD 104 is controlled to interrupt the fault current by opening the other of the switch device 110 in the SSSD 104. That is, in response to failing to interrupt the electric current within the defined period of time at the circuit breaker 106 of the one or more circuit breakers 106 in the DC power circuit 102, the other of the switch devices 110 is then also opened. Opening the other of the switch device 110 is configured to commutate the electric current to the varistor 114 connected in parallel to that switch device 110 and interrupts the electric current at the SSSD 104. When this occurs, the voltage develops across the other switch device 110 and the electric current and voltage across the SSSD 104 is effectively reduced to zero, thereby interrupting electric current being supplied from the power source to the downstream electrical devices. For example, the switch device 110a may first be opened upon determining a fault event is occurring at one of the downstream circuit breakers 106, and if the downstream circuit breakers 106 does not open within the pre-defined period of time, the switch device 110b may also be opened to interrupt the electric current across the SSSD 104 and to protect the electrical devices connected to the DC power circuit 102 from damage.

According to some embodiments, to further extend the maximum current limiting time, an extra control scheme can be applied using the SSSD 104. In this regard, if switch device 110a is configured to be switched open to perform the electric current limiting and switch device 110b is configured to be switched open to interrupt the electric current if the circuit breaker 106 does not open during the pre-defined period of time, the extra control scheme may include utilizing varistor 114a to limit the current after varistor 114b. That is, after varistor 114a reaches the maximum current limiting time $t_{CL}$, one can turn on (close) switch device 110a and turn off (open) switch device 110b. Thus, varistor 114a is effectively short circuited and varistor 114b breaks down to dissipate the energy for current limiting. Since a micro henry inductance exists in the DC power circuit 102, the deadtime from switching from switch device 110a to switch device 110b would not have a significant influence on fault current. After both the varistors 114 (e.g., varistor 114a and varistor 114b) have then performed this current limiting operation, switch device 110a and switch device 110b can both be turned off to interrupt the fault. For example, both switch device 110a and switch device 110b can both be switched open to interrupt the fault at SSSD 104 if the respective downstream circuit breaker 106 fails to open during the predefined period of time (e.g., current limiting interval).

It is to be appreciated by those having ordinary skill in the art that each switch device 110 in SSSD 104 can be independently controlled to turn ON and OFF to close and open, respectively. Also, each switch device 110 can include any combination of active turn-off semiconductor devices to perform the current limiting and interruption operations in accordance with the present disclosure.

Figures 6, 7:
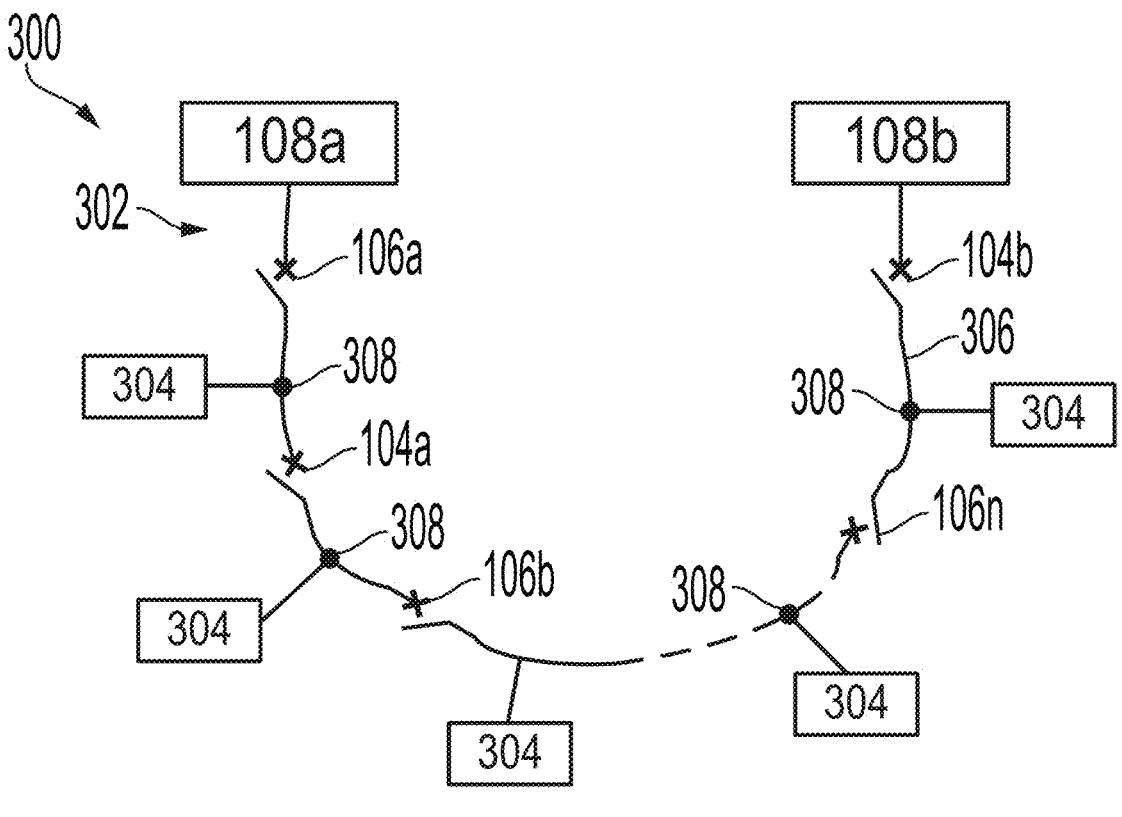
FIG. 6 is a schematical diagram illustrating a non-limiting example of a system, according to some embodiments.
FIG. 7 is a schematical diagram illustrating a non-limiting example of a system, according to some embodiments.

FIG. 6 is a schematic diagram illustrating a non-limiting example of a system 300, according to some embodiments. System 300 may include a DC power circuit 302 having a ring network topology. System 300 includes two power sources 108, SSSD 104a, SSSD 104b, circuit breakers 106a, circuit breakers 106b, and through circuit breakers 106 n. System 300 also includes electrical loads 304 connected to a bus 306 of the DC power circuit 302 at a corresponding respective terminal 308. It is to be appreciated by those having ordinary skill in the art that the components and the topology shown in FIG. 6 as being included in system 300 is exemplary and is not intended to be limiting. That is, the DC power circuit 302 may include one or more other types of components including, but not limited to, SSSD 104, circuit breakers 106, power source 108, electrical loads 304, or any combinations thereof, and may include different configurations than shown in FIG. 6.

In system 300, the SSSD 104 may be capable of providing fault current limiting protection to the series connected circuit breakers 106. In some embodiments, the electrical loads 304 may be connected to the bus 306 at a respective terminal 308, and a circuit breakers 106 may be associated with each of the feeder lines connected to the bus 306 to provide fault current protection to the connected electrical devices on the respective lines.

In system 300, SSSD 104a can limit fault current to $I_{th2}$ if there is a fault to the right of circuit breakers 106b to allow circuit breakers 106b enough time to clear the fault. If the fault occurs near power source 108a, then SSSD 104a can limit the fault current to a different level $I_{th1}$ to allow circuit breakers 106a enough time to clear the fault. In this regard, in the same network of system 300, DC power circuit 302 stays the upstream breaker, but the downstream breaker can change depending on the fault location. The current limiting levels can also be different depending on the fault location and fault current direction, as can be appreciated by those having ordinary skill in the art.

FIG. 7 is a schematic diagram illustrating a non-limiting example of a system 400, according to some embodiments. The system 400 may be a radial power system with two DC power source 108, e.g., power source 108a and power source 108b. System 400 includes SSSD 104a in series connection between power source 108a and the circuit breakers 106, and SSSD 104b in series connection between power source 108b and the circuit breakers 106. The circuit breakers 106 includes circuit breakers 106a, circuit breakers 106b, and through circuit breakers 106 n. In system 400, the electrical loads (not shown) may be connected to the feeder lines associated with the circuit breakers 106, which are connected to DC bus 404.

In system 400, the SSSD 104a and SSSD 104b are capable of fault current limiting protection. SSSD 104a can limit fault current to $I_{th2}$ if there is a fault at power source 108b to allow SSSD 104b enough time to clear the fault. Correspondingly, if the fault occurs such as, for example, at power source 108a, then SSSD 104b can limit the fault current to a different level $I_{th1}$ to allow SSSD 104a enough time to clear the fault. So, in this network of system 400, SSSD 104a and SSSD 104b can serve as either be the upstream breaker or the downstream breaker depending on the fault location. Additionally, SSSD 104a and SSSD 104b can also provide fault current limiting for all faults located after the circuit breakers 106 (e.g., circuit breakers 106a, 106b, through 106 n) where SSSD 104a and SSSD 104b are upstream breakers.

System 400 may further include a controller 402. The controller 402 is configured to send command signals to the SSSD 104 and the circuit breakers 106 to selectively turn ON and OFF the SSSD 104 and circuit breakers 106. In this regard, the controller 402 is configured to selectively control an operation of the FQSs 110 and corresponding semiconductor devices 116 in the respective SSSD 104 to maintain the electric current at the SSSD 104 at a certain level for a defined period of time. That is, the controller selectively turns OFF the switch device 110 and the corresponding semiconductor devices 116 therein using a single turn-off shot rather than using pulse width control.

The controller 402 may include gate drive units (not shown), that can command the SSSD 104, circuit breakers 106, or any components therein to independently switch ON and OFF at separate timing moments. In this regard, the controller 402 provides digital commands to the correct gate drive units at the right time intervals for performing the fault current limiting function in accordance with the present disclosure. In some embodiments, the SSSD 104 and the circuit breakers 106 in system 400 may include a local controller for monitoring parameters associated with the local device. In addition, in some embodiments, each local controller may or may not be in electronic communicable connection with other local CB controllers either directly or through a central higher-level controller that coordinates the fault current limiting protection in the DC circuit. It is to be appreciated by those having ordinary skill in the art that the fault current limiting protection functionality as described herein is an improvement to conventional control circuits that are configured to perform basic SSCB operations.

It is to be appreciated by those having ordinary skill in the art that although the controller 402 is shown as being included in system 400, this is exemplary and not intended to be limiting. As such, any of the systems described herein may include a controller for controlling the operation of the one or more components in the respective systems to enable providing the fault current limiting protection in accordance with the present disclosure. For example, any of the system 100, system 300, and system 400 may include the controller 402 therein.

Figure 9:
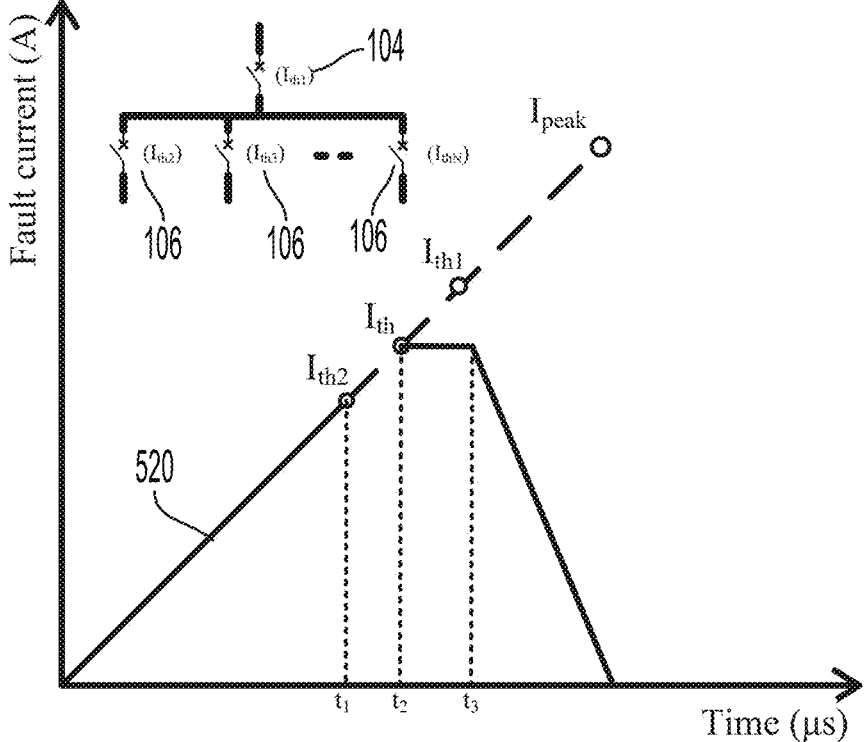
FIG. 9 is a graphical diagram illustrating performing the fault current limiting protection, according to some embodiments.

FIG. 8 is a flow diagram illustrating a method 500, according to some embodiments. FIG. 9 is a graphical diagram illustrating performing the fault current limiting protection, according to some embodiments. The method 500 will be described collectively with FIG. 9.

The method 500 may be for providing fault current limiting protection in a power circuit such as, for example, a DC power circuit. The power circuit may include an upstream CB, the upstream CB being a SSSD and including at least one switch device and a varistor connected in parallel across the at least one switch device. The SSSD may be upstream of one or more circuit breakers and the SSSD may be in series connection with the one or more circuit breakers.

The method 500, at block 502, includes opening, in response to determining a fault at a circuit breaker of the one or more circuit breakers and based on an electric current reaching a threshold, the at least one switch device for a defined period of time to commutate the electric current to the varistor and cause a voltage across the at least one switch device to increase. According to some embodiments, as shown in FIG. 1, the SSSD may correspond to SSSD 104 and the circuit breakers may correspond to circuit breakers 106. According to some embodiments, as shown in FIG. 2, the at least one switch device may correspond to switch device 110 and the varistor may correspond to voltage clamping circuit 112. In some embodiments, the voltage clamping circuit may correspond to varistor 114.

In some embodiments, the at least one switch device may include a first switch device located on a first pole and a second switch device located on a second pole. In addition, in some embodiments, opening the at least one switch device for the defined period of time may include opening one of the first switch device or the second switch device for the defined period of time. Referring to FIG. 2, the first switch device may correspond to switch device 110*a* and the second switch device may correspond to switch device 110*b*.

Referring to FIG. 9, the SSSD is configured to limit a fault current 520 to $I_{th}$. When the fault occurs, the fault current 520 rises in the SSSD and the downstream CB. If the fault current 520 were to reach $I_{peak}$ such as, for example, if there were no current limiting provided, both the SSSD 104 and the circuit breaker 106 associated with the fault would trip open. At $t_1$, the fault current 520 is sensed in the DC power circuit, the fault current 520 corresponding to $I_{th2}$. At $t_2$, the SSSD enters current limiting mode as the fault current 520 reaches $I_{th}$. In some embodiments, in the fault current limiting mode, the SSSD limits the fault current 520 to $I_{th}$.

The method 500, at block 504, includes opening the circuit breaker of the one or more circuit breakers to clear the fault and interrupt the electric current within the defined period of time. Referring to FIG. 9, at $t_3$, the fault is cleared by the downstream CB switching open such that the fault current drops down to zero in the DC power circuit.

The method 500, at block 506, includes closing, in response to opening the circuit breaker of the one or more circuit breakers within the defined period of time, the at least one switch device to place the power circuit in a normal operating state. That is, once the fault current protection is achieved by opening the affected circuit breaker of the one or more circuit breakers, the SSSD may be switched to the closed state to resume normal operations and directing electrical current from a respective electrical power source to the downstream load devices still connected to the DC power circuit. Referring to FIG. 1, the electrical power source may correspond to power source 108 and the electrical load devices may be downstream of circuit breakers 106 on the respective feeder lines.

A controller may be configured to perform the fault current limiting functionality of method 500 including controlling the one or more components to perform the operations as described in, at least, blocks 502, 504, and 506. The controller is configured to send gate command signals to the at least one switch device to selectively turn ON and OFF the at least one switch device using a single turn-off shot. In some embodiments, the controller does not utilize pulse width modulation to control an operation of the at least one switch device. In some embodiments, the SSSD and each of the circuit breakers may include a local controller configured to control an operation of the respective device and to monitor the parameters at the device. In some embodiments, the local controllers may be in electronic communicable connection with one or more other controllers to perform the fault current protection. In other embodiments, the local controllers may be in electronic communicable connection with a higher-level master controller that coordinates operation of the other devices to enable performing the fault current limiting protection.

Figure 10:
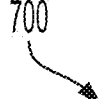
FIG. 10 is a flow diagram illustrating a method, according to some embodiments.
Figure 11:
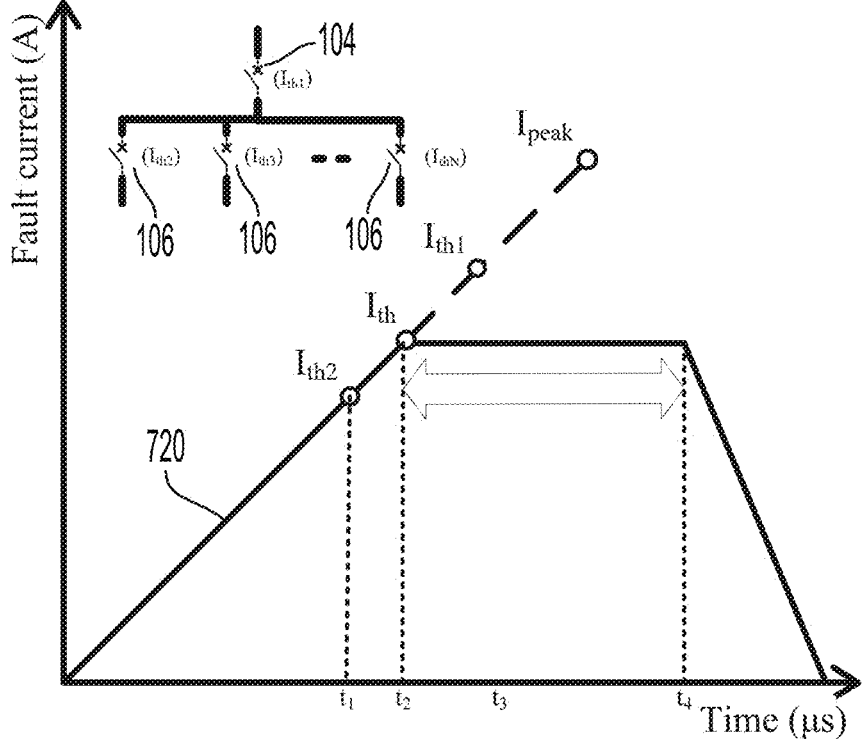
FIG. 11 is a graphical diagram illustrating performing the fault current limiting protection, according to some embodiments.

FIG. 10 is a flow diagram illustrating a method 700, according to some embodiments. FIG. 11 is a graphical diagram illustrating performing the fault current limiting protection, according to some embodiments. The method 700 will be described collectively with FIG. 11.

The method 700 may follow the method 500 in FIG. 8, according to some embodiments. In some embodiments, the method 700 may follow block 504 of FIG. 8. The method 700 is performed in DC power circuits having SSSDs including a first switch device and a second switch device, and when the affected circuit breaker of the one or more circuit breakers fails to open within the defined period of time. In some embodiments, the first switch device may be located on the first pole and the second switch device may be located on a second pole.

When the at least one switch device includes the first and second switch device, opening the at least one switch device for the defined period of time includes opening one of the first switch device or the second switch device for the defined period of time. The method 700, at block 702, includes opening, in response to failing to clear the fault within the defined period of time by the circuit breaker of the one or more circuit breakers, an other of the first switch device and the second switch device to commutate the electric current to the varistor connected in parallel to the other of the first switch device and the second switch device to interrupt the electric current at the SSSD.

Referring to FIG. 2, the one of the first switch device or the second switch device corresponds to one of the switch device 110*a* or the switch device 110*b*. That is, when a fault is determined as occurring at a circuit breaker of the one or more circuit breakers, one of the switch device 110*a* or the switch device 110*b* is opened for the defined period of time. In addition, referring again to FIG. 2, an other of the first switch device and the second switch device corresponds to an other of the switch device 110*a* and switch device 110*b* that was not opened when the fault was determined at the affected circuit breaker. That is, for example, assuming switch device 110*a* was opened in response to determining the fault at one of the affected downstream circuit breaker, the switch device 110*b* is then opened in response to the affected downstream circuit breaker failing to clear the fault within the defined period of time. In this regard, when the affected circuit breaker fails to interrupt the fault at the circuit breaker, the other one of the first switch device and the second switch device opens to interrupt the electric current being directed through the SSSD to protect the other devices connected to the DC power circuit.

Referring to FIG. 11, when there is a fault, the electric fault current 720 rises in the SSSD 104 and the circuit breakers 106. The SSSD 104 is configured to limit fault current 720 to $I_{th}$ for a defined period of time. At $t_1$, the fault is sensed by the SSSD 104 and circuit breakers 106. In some embodiments, the fault may be sensed by a controller configured to perform the current limiting protection. The maximum period of time the SSSD 104 performs the current limiting can be defined as being between $t_2$ and $t_4$. At $t_2$, the time the SSSD 104 enters current limiting mode is represented, which may also correspond to the threshold ($I_{th}$). That is, one of the switch device 110*a* and switch device 110*b* at SSSD 104 may be opened. At $t_4$, the maximum current limiting time for the SSSD 104 is represented which defines the maximum time period that the SSSD 104 waits for the affected circuit breaker 106 to clear the fault. After $t_4$, the other of the switch device 110*a* and switch device 110*b* at the SSSD 104 is opened to commutate the electric current to varistor 114 connected in parallel to the other of the switch device 110 and switch device 110*b* to interrupt the electric current at the SSSD 104. In some embodiments, a controller may be configured to perform the fault current limiting functionality of method 700 including controlling the one or more components to perform the operations as described in, at least, block 702.

Figure 12:
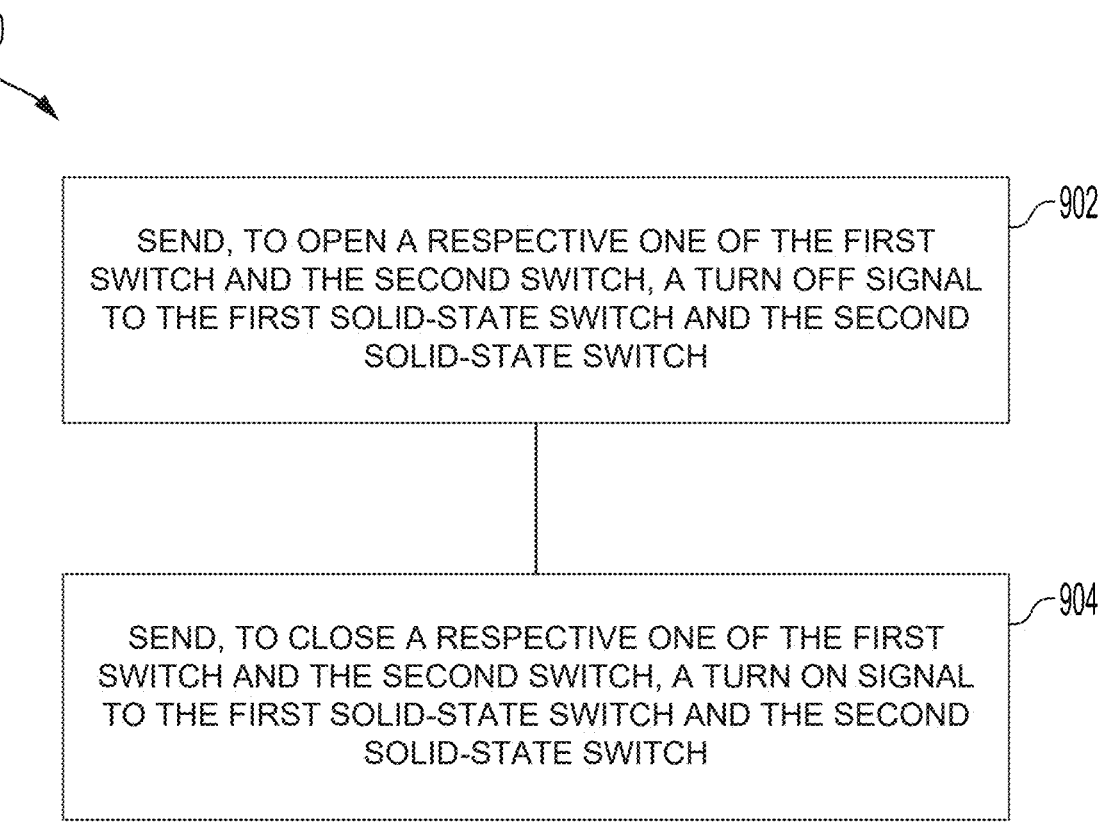
FIG. 12 is a flow diagram illustrating a method performing the fault current limiting protection, according to some embodiments.

FIG. 12 is a flow diagram illustrating a method 900 performing the fault current limiting protection, according to some embodiments.

Each of the first switch and the second switch may include a first semiconductor device and a second semiconductor device, and the method 900 includes, at block 902, sending, to open a respective one of the first switch and the second switch, a turn OFF signal to the first solid-state switch and the second solid-state switch. The method 900, at block 904, may include sending, to close a respective one of the first switch and the second switch, a turn ON signal to the first solid-state switch and the second solid-state switch.

The first semiconductor device may correspond to one of the semiconductor device 116 *a* and semiconductor device 116 *b* and the second semiconductor device may correspond to the other of the semiconductor device 116 *a* and semiconductor device 116 *b* in the respective one of the switch device 110 as shown, for example, in FIG. 2. In some embodiments, a controller may be configured to perform the fault current limiting functionality of method 900 including controlling the one or more components to perform the operations as described in, at least, blocks 902 and 904.

Figure 13:
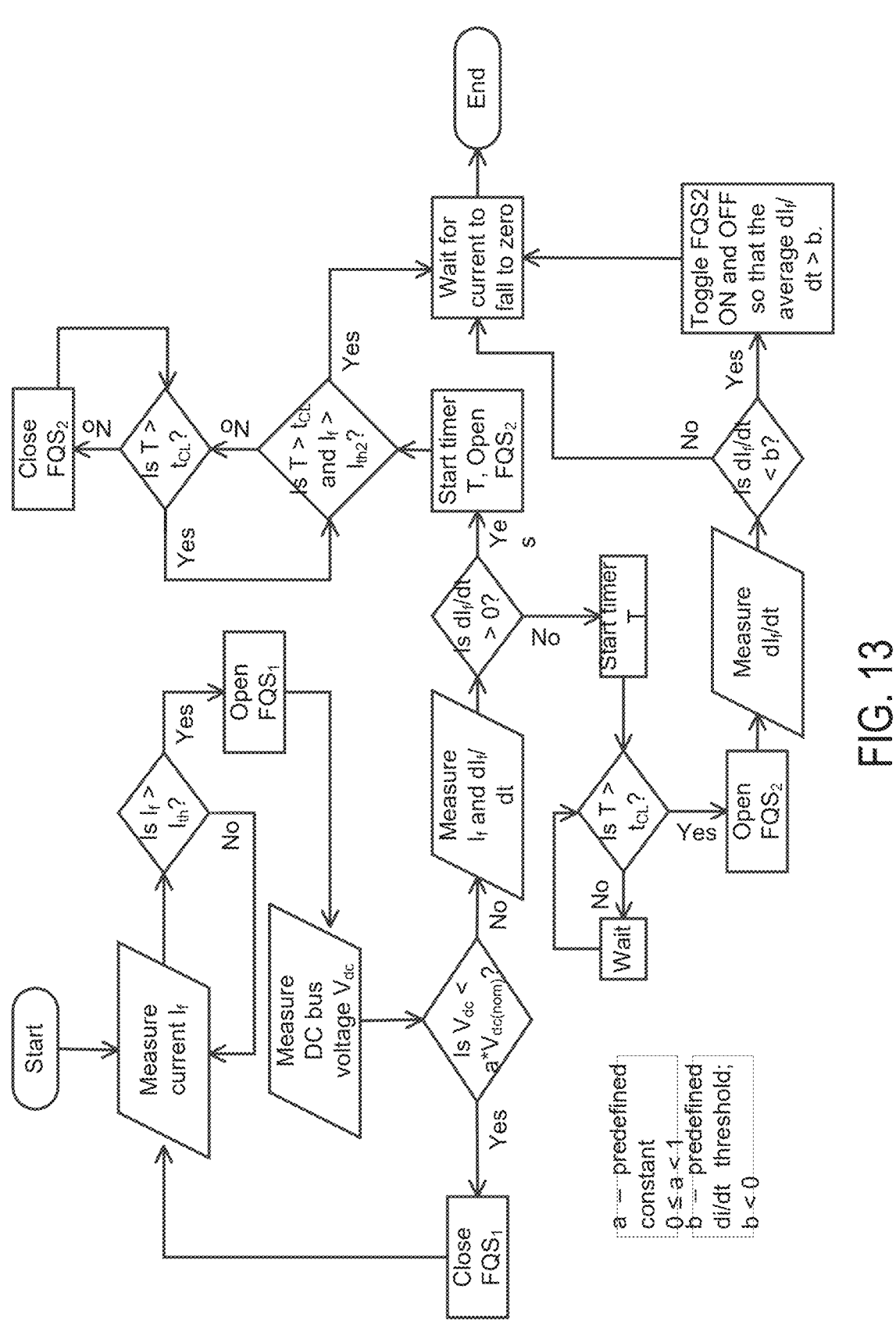
FIG. 13 is a flow diagram illustrating performing the fault current limiting protection in the system, according to some embodiments.

FIG. 13 is a flow diagram illustrating performing the fault current limiting protection in the system 100 of FIG. 1, according to some embodiments.

To provide the fault current limiting protection in the system 100, the electric current (i.e., fault current) may be limited to a particular threshold level $I_{th}$ such that $I_{th} > I_{thi}$, and $I_{th} < I_{th1}$, where $I_{thi}$ is the fault current trip threshold of the $I_{th}$ CB (i.e., downstream CB) and where $I_{th1}$ is the fault current trip threshold of the upstream CB. The fault current may be held at $I_{th}$ by the upstream CB for a pre-set amount of time (defined period of time) to give the downstream CB enough time to trip and clear the fault current. Opening the one of the switch device 110 in the upstream CB is configured to commutate the electric current to the varistor in the upstream CB and thereby cause a voltage to increase across the respective one of the switch device 110 in the upstream CB to allow the downstream CB time to switch open in response to the fault condition. In this regard, proper breaker coordination between the upstream and downstream CBs is maintained, and thus the reliability of the DC power system is improved.

If $L_f$ is the fault inductance, and $V_{dc}$ is the source voltage of the DC power circuit 102 being protected by SSSD 104, the rate of rise of fault current in the DC power circuit 102 can be:

$$\frac{dI_f}{dt} = \frac{V_{dc}}{L_f},$$

where when the electric current commutates to the varistor 114 (VAR₁) as the switch device 110 (FQS₁) opens, a voltage $V_{MOV}$ develops across the varistor 114 (VAR₁) and the rate of rise of fault current in the DC power circuit 102 drops to:

$$\frac{dI_f}{df}\Big|_{FQS_1 open} = \frac{(V_{dc} - V_{MOV})}{L_f}.$$

-continued
$$\frac{dI_f}{dt}\Big|_{FQS_1 open} = \frac{(V_{dc} - V_{MOV})}{L_f}$$

The varistor 114 across each switch device 110 can be selected so that $V_{MOV}$ at the fault current $I_f = I_{th}$ (designed fault current limiting level) is close to or equal to $V_{dc}$ for the DC power circuit 102: $V_{dc} \approx V_{MOV}$. By doing so:

$$\frac{dI_f}{dt}\Big|_{FQS_1 open} \approx 0,$$

and the SSCB can stay in this state if the energy dissipated in the varistor 114 (VAR₁) stays under the thermal limit for the varistor selected in the design. The power dissipation in the varistor 114 (VAR₁) during the current limiting interval is given as:

$$P_{MOV_1(CL)} = V_{MOV} \times I_{th}.$$

Since both $V_{MOV}$ and $I_{th}$ remain approximately the same over the entire duration of the current limiting interval $t_{CL}$, the energy dissipated in the varistor 114 (VAR₁) during the current limiting interval, $E_{MOV1(CL)}$ is given as:

$$E_{MOV_1(CL)} = P_{MOV_1(CL)} \times t_{CL} = V_{MOV} \times I_{th} \times t_{CL}.$$

If the downstream circuit breaker 106 fails to interrupt the fault within the current limiting interval (e.g., defined time period), the SSSD 104 (or the controller associated with performing the fault current limiting protection) assumes that either the circuit breaker 106 has failed, or the fault has occurred on the DC distribution bus. In this situation, the SSSD 104 interrupts the fault by opening the other of the switch device 110 (FQS₂). That is, in response to failing to interrupt the electric current within the defined period of time at a semiconductor device 116 of the one or more switching devices 116 in the DC power circuit 102, an other of the switch device 110 is opened. Opening the other of the switch device 110 is configured to commutate the electric current to the varistor 114 connected in parallel to the other of the switch device 110 to interrupt the electric current at the SSSD 104. When this occurs, the fault current now commutates to the varistor 114 (VAR₂) and a voltage develops across the other switch device 110 (FQS₂).

When the current has fully commutated to varistor 114 (VAR₂), the fault di/dt becomes:

$$\frac{dI_f}{dt}\Big|_{FQS_2 open} = \frac{(V_{dc} - 2V_{MOV})}{L_f} < 0.$$

In this situation, the fault current in the DC power circuit 102 rapidly reduces to zero. There may be some energy dissipation within varistor 114 (VAR₁) during the current interruption, and it can be approximated by assuming that the fault current reduces linearly and the MOV voltage stays constant. The energy dissipated can be approximated as:

$$E_{MOV_1 (int)} = \frac{1}{2}\left(V_{MOV_1}\right)_{avg} \times I_{th} \times t_{int},$$

where the fault current interruption time $t_{int}$ can be evaluated as:

$$t_{int} = \frac{L_f I_{th}}{2V_{MOV} - V_{dc}} \approx \frac{L_f I_{th}}{\left(V_{MOV_1}\right)_{avg}}.$$

It can be seen that the energy dissipated in varistor 114 (VAR₁) is:

$$E_{MOV_1 (int)} = \frac{1}{2}L_f I_{th}^2,$$

where the total energy dissipated in varistor 114 (VAR₁) is the sum of the energy dissipation during the current limiting stage and the current interruption stage. If varistor 114 (VAR₁) has a maximum energy dissipation rating $E_{max}$, the maximum current limiting time for this design is given as:

$$t_{CL} = \frac{E_{max} - 0.5 L_f I_{th}^2}{V_{MOV} \times I_{th}},$$

and the maximum current limiting time $t_{CL}$ can be extended by increasing $E_{max}$ for a given system design.

According to some embodiments, to further extend the maximum current limiting time, an extra control scheme can be applied to utilize varistor 114 (VAR₂) to limit the current after varistor 114 (VAR₁). After varistor 114 (VAR₁) reaches the maximum current limiting time $t_{CL}$, one can turn on switch device 110 (FQS₁) and turn off switch device 110 (FQS₂). Thus, varistor 114 (VAR₁) is effectively short circuited and varistor 114 (VAR₂) breaks down to dissipate the energy for current limiting. Since a micro henry inductance exists in the system 100 and DC power circuit 102, the deadtime from switching from switch device 110 (FQS₁) to switch device 110 (FQS₂) would not have a significant influence on fault current. After both the varistor 114 (e.g., varistor 114a and varistor 114b) have performed the current limiting operations, switch device 110a and switch device 110b can both be turned off to interrupt the fault. For example, switch device 110a and switch device 110b can both be turned off to interrupt the fault at SSSD 104 if the respective circuit breaker 106 fails to open during the predefined period of time (e.g., current limiting interval).

It is to be appreciated by those having ordinary skill in the art that each switch device 110 in SSSD 104 can be independently controlled to turn ON and OFF. Each switch device 110 including any combination of active turn-off semiconductor devices, and each switch device 110 including a voltage clamping circuit connected in parallel with the switch device 110. It is also to be appreciated that the system 100 can include sensor devices for detecting voltage, current, other characteristics, or any combinations thereof, to enable the system 100 to perform the operations in accordance with the present disclosure.

All prior patents and publications referenced herein are incorporated by reference in their entireties.

Throughout the specification and claims, the following terms take the meanings explicitly associated herein, unless the context clearly dictates otherwise. The phrases "in one embodiment," "in an embodiment," and "in some embodiments" as used herein do not necessarily refer to the same embodiment(s), though it may. Furthermore, the phrases "in another embodiment" and "in some other embodiments" as used herein do not necessarily refer to a different embodiment, although it may. All embodiments of the disclosure are intended to be combinable without departing from the scope or spirit of the disclosure.

As used herein, the term "based on" is not exclusive and allows for being based on additional factors not described, unless the context clearly dictates otherwise. In addition, throughout the specification, the meaning of "a," "an," and "the" include plural references. The meaning of "in" includes "in" and "on."

As used herein, the term "between" does not necessarily require being disposed directly next to other elements. Generally, this term means a configuration where something is sandwiched by two or more other things. At the same time, the term "between" can describe something that is directly next to two opposing things. Accordingly, in any one or more of the embodiments disclosed herein, a particular structural component being disposed between two other structural elements can be:

disposed directly between both of the two other structural elements such that the particular structural component is in direct contact with both of the two other structural elements;

disposed directly next to only one of the two other structural elements such that the particular structural component is in direct contact with only one of the two other structural elements;

disposed indirectly next to only one of the two other structural elements such that the particular structural component is not in direct contact with only one of the two other structural elements, and there is another element which juxtaposes the particular structural component and the one of the two other structural elements;

disposed indirectly between both of the two other structural elements such that the particular structural component is not in direct contact with both of the two other structural elements, and other features can be disposed therebetween; or any combination(s) thereof.

Aspects

Various Aspects are described below. It is to be understood that any one or more of the features recited in the following Aspect(s) can be combined with any one or more other Aspect(s).

Aspect 1. A device for providing fault current protection in a power circuit, the device comprising: a solid-state switching device (SSSD) comprising: at least one switch device comprising: a first semiconductor device; a voltage clamping circuit, wherein the voltage clamping circuit is connected in parallel with the at least one switch device; and one or more circuit breakers, wherein the one or more circuit breakers are connected in series with the SSSD; wherein, in response to determining a fault at a circuit breaker of the one or more circuit breakers, selectively controlling an operation of the at least one switch device to maintain an electric current at a threshold for a defined period of time to enable clearing the fault at the circuit breaker.

Aspect 2. The device according to any of the preceding aspects, wherein selectively controlling the operation of the at least one switch device to maintain the electric current at the threshold for the defined period of time comprises: opening, in response to the electric current reaching the threshold, the at least one switch device to commutate the electric current to the voltage clamping circuit and cause a voltage to increase across the at least one switch device; wherein the fault at the circuit breaker is determined based on a measured electric current at the circuit breaker exceeding a second threshold.

Aspect 3. The device according to any of the preceding aspects, wherein the voltage clamping circuit comprises a fault current limiting level configured to maintain a voltage across the at least one switch device consistent with a voltage in the power circuit while commutating the electric current during the defined period of time.

Aspect 4. The device according to any of the preceding aspects, wherein the at least one switch device further comprises: a second semiconductor device; wherein the voltage clamping circuit comprises a varistor in parallel connection across the first semiconductor device and the second semiconductor device.

Aspect 5. The device according to aspect 4, wherein the first semiconductor device and the second semiconductor device comprise metal-oxide-semiconductor field-effect transistors (MOSFETs), insulated-gate bipolar transistors (IGBTs), integrated gate-commutated thyristors (IGCTs), bipolar transistors, Darlington transistors, field effect transistors (FETs), silicon-controlled rectifiers (SCRs), thyristors, triacs, unijunction transistors, diodes, or any combinations thereof.

Aspect 6. The device according to aspects 4 or 5, wherein the first semiconductor device is in anti-series connection with the second semiconductor device; wherein the first semiconductor device and the second semiconductor device comprise MOSFETs.

Aspect 7. The device according to aspects 4 or 5, wherein the first semiconductor device is in anti-parallel connection with the second semiconductor device; wherein the first semiconductor device and the second semiconductor device comprise IGCTs.

Aspect 8. The device according to any of the preceding aspects, wherein the at least one switch device comprises: a first switch device, and a second switch device. wherein controlling the operation of the at least one switch device to maintain the electric current at the threshold during the defined period of time further comprises: opening, in response to the electric current reaching the threshold, one of the first switch device or the second switch device to commutate the electric current to a respective voltage clamping circuit and cause a voltage to increase across the one of the first switch device or the second switch device; and opening, in response to failing to clear the fault at the circuit breaker within the defined period of time, an other of the first switch device and the second switch device to commutate the electric current to the respective voltage clamping circuit and interrupt the electric current at the SSSD; wherein the fault at the circuit breaker is determined based on a measured electric current at the circuit breaker exceeding a second threshold.

Aspect 9. The device according to any of the preceding aspects, further comprising: a controller, wherein the controller is configured to send gate command signals to the at least one switch device to selectively turn ON and OFF the at least one switch device using a single turn-off shot.

Aspect 10. The device according to aspect 9, wherein the controller does not utilize pulse width modulation to control the operation of the at least one switch device.

Aspect 11. A system for providing electric current fault protection in a power circuit, the system comprising: a solid-state switching device (SSSD) comprising: at least one switch device comprising: a first semiconductor device, and a varistor in parallel connection with the at least one switch device; one or more circuit breakers; and wherein, in response to determining a fault at a circuit breaker of the one or more circuit breakers, selectively controlling an operation of the at least one switch device to maintain the electric current at a fault current trip threshold for a defined period of time to enable clearing the fault at the circuit breaker; wherein the varistor comprises a fault current limiting level configured to maintain a voltage across the at least one switch device consistent with a voltage in the power circuit while commutating the electric current during the defined period of time.

Aspect 12. The system according to aspect 11, wherein selectively controlling the operation of the at least one switch device to maintain the electric current at the threshold during the defined period of time comprises: opening, in response to the electric current reaching the fault current trip threshold, the at least one switch device to commutate the electric current to the varistor and cause the voltage to increase across the at least one switch device; wherein the fault at the circuit breaker is determined based on a measured electric current at the circuit breaker exceeding a second threshold.

Aspect 13. The system according to aspects 11 or 12, wherein the at least one switch device further comprises: a second semiconductor device, wherein the first semiconductor device is in anti-series connection with the second semiconductor device; wherein the first semiconductor device and the second semiconductor device comprise MOSFETs.

Aspect 14. The system according to aspects 11, 12, or 13, wherein the at least one switch device further comprises: a second semiconductor device, wherein the first semiconductor device is in anti-parallel connection with the second semiconductor device; wherein the first semiconductor device and the second semiconductor device comprise IGCTs.

Aspect 15. The system according to aspects 11, 12, 13, or 14, wherein the at least one switch device comprises: a first switch device, and a second switch device; wherein the varistor comprises a first varistor in parallel connection with the first switch device and a second varistor in parallel connection with the second switch device.

Aspect 16. The system according to aspect 15, wherein controlling the operation of the at least one switch device to maintain the electric current at the threshold during the defined period of time further comprises: opening, in response to the electric current reaching the fault current trip threshold, one of the first switch device or the second switch device to commutate the electric current to a respective one of the first varistor or the second varistor and cause a voltage to increase across the one of the first switch device or the second switch device; opening the circuit breaker of the one or more circuit breakers to clear the fault within the defined period of time; and closing, in response to opening the circuit breaker of the one or more circuit breakers, the one of the first switch device or the second switch device; wherein the fault current trip threshold comprises a level Ith such that Ith>Ithi, and Ith<Ith1, Ithi being the fault current trip threshold of the circuit breaker and Ith1 being the fault current trip threshold of the SSSD.

Aspect 17. The system according to aspect 15 or 16, wherein controlling the operation of the at least one switch device to maintain the electric current at the fault current trip threshold during the defined period of time further comprises: opening, in response to failing to clear the fault within the defined period of time, an other of the first switch device and the second switch device to commutate the electric current to a respective first varistor or the second varistor to interrupt the electric current at the SSSD.

Aspect 18. The system according to aspects 11, 12, 13, 14, 15, 16, or 17, further comprising: a controller, and wherein the controller is configured to send gate command signals to the at least one switch device to selectively turn ON and OFF the at least one switch device using a single turn-off shot, wherein the controller does not utilize pulse width modulation to control the operation of the at least one switch device.

Aspect 19. A method for providing fault protection in a power circuit, the power circuit including a solid-state switching device (SSSD) comprising at least one switch device and a varistor connected in parallel across the at least one switch device, the SSSD connected upstream of one or more circuit breakers, the method comprising: opening, by a controller in response to determining a fault at a circuit breaker of the one or more circuit breakers and based on an electric current reaching a threshold, the at least one switch device for a defined period of time to commutate the electric current to the varistor and cause a voltage across the at least one switch device to increase; opening, by the controller, the circuit breaker of the one or more circuit breakers to clear the fault within the defined period of time; and closing, by the controller in response to opening the circuit breaker of the one or more circuit breakers and clearing the fault within the defined period of time, the at least one switch device; wherein the controller is configured to send gate command signals to the at least one switch device to selectively turn ON and OFF the at least one switch device using a single turn-off shot, and wherein the controller does not utilize pulse width modulation to control an operation of the at least one switch device.

Aspect 20. The method according to aspect 19, wherein the at least one switch device comprises a first switch device located on a first pole and a second switch device located on a second pole, and wherein opening the at least one switch device for the defined period of time comprises opening one of the first switch device or the second switch device for the defined period of time, and wherein the method further comprises: opening, by the controller in response failing to clear the fault within the defined period of time, an other of the first switch device and the second switch device to commutate the electric current to the varistor connected in parallel to the other of the first switch device and the second switch device to interrupt the electric current at the SSSD.

It is to be understood that changes may be made in detail, especially in matters of the construction materials employed and the shape, size, and arrangement of parts without departing from the scope of the present disclosure. This Specification and the embodiments described are examples, with the true scope and spirit of the disclosure being indicated by the claims that follow.

What is claimed is:

1. A device for providing fault current protection in a power circuit, the device comprising:
   a solid-state switching device (SSSD) comprising:
      at least one switch device comprising:
         a first semiconductor device;
      a voltage clamping circuit,
         wherein the voltage clamping circuit is connected in parallel with the at least one switch device,
         wherein the voltage clamping circuit comprises a fault current limiting level configured to maintain a voltage across the at least one switch device consistent with a voltage in the power circuit while commutating an electric current during a defined period of time;
   one or more circuit breakers,
      wherein the one or more circuit breakers are connected in series with the SSSD;
      wherein, in response to determining a fault at a circuit breaker of the one or more circuit breakers, selectively controlling an operation of the at least one switch device to maintain the electric current at a threshold for the defined period of time to enable clearing the fault at the circuit breaker.

2. The device of claim 1, wherein selectively controlling the operation of the at least one switch device to maintain the electric current at the threshold for the defined period of time comprises:
   opening, in response to the electric current reaching the threshold, the at least one switch device to commutate the electric current to the voltage clamping circuit and cause a voltage to increase across the at least one switch device;
   wherein the fault at the circuit breaker is determined based on a measured electric current at the circuit breaker exceeding a second threshold.

3. The device of claim 1, wherein the at least one switch device further comprises:
   a second semiconductor device;
   wherein the voltage clamping circuit comprises a varistor in parallel connection across the first semiconductor device and the second semiconductor device.

4. The device of claim 3, wherein the first semiconductor device and the second semiconductor device comprise metal-oxide-semiconductor field-effect transistors (MOSFETs), insulated-gate bipolar transistors (IGBTs), integrated gate-commutated thyristors (IGCTs), bipolar transistors, Darlington transistors, field effect transistors (FETs), silicon-controlled rectifiers (SCRs), thyristors, triacs, unijunction transistors, diodes, or any combinations thereof.

5. The device of claim 3, wherein the first semiconductor device is in anti-series connection with the second semiconductor device;
   wherein the first semiconductor device and the second semiconductor device comprise MOSFETs.

6. The device of claim 3, wherein the first semiconductor device is in anti-parallel connection with the second semiconductor device;
   wherein the first semiconductor device and the second semiconductor device comprise IGCTs.

7. The device of claim 1, wherein the at least one switch device comprises:
   a first switch device, and
   a second switch device,
   wherein controlling the operation of the at least one switch device to maintain the electric current at the threshold during the defined period of time further comprises:
      opening, in response to the electric current reaching the threshold, one of the first switch device or the second switch device to commutate the electric current to a respective voltage clamping circuit and cause a voltage to increase across the one of the first switch device or the second switch device; and
      opening, in response to failing to clear the fault at the circuit breaker within the defined period of time, an other of the first switch device and the second switch device to commutate the electric current to the respective voltage clamping circuit and interrupt the electric current at the SSSD;

wherein the fault at the circuit breaker is determined based on a measured electric current at the circuit breaker exceeding a second threshold.

8. The device of claim 1, further comprising:

a controller, wherein the controller is configured to send gate command signals to the at least one switch device to selectively turn ON and OFF the at least one switch device using a single turn-off shot.

9. The device of claim 8, wherein the controller does not utilize pulse width modulation to control the operation of the at least one switch device.

10. A system for providing electric current fault protection in a power circuit, the system comprising:

a solid-state switching device (SSSD) comprising:

at least one switch device comprising:

a first semiconductor device, and a varistor in parallel connection with the at least one switch device;

one or more circuit breakers; and wherein, in response to determining a fault at a circuit breaker of the one or more circuit breakers, selectively controlling an operation of the at least one switch device to maintain the electric current at a fault current trip threshold for a defined period of time to enable clearing the fault at the circuit breaker;

wherein the varistor comprises a fault current limiting level configured to maintain a voltage across the at least one switch device consistent with a voltage in the power circuit while commutating the electric current during the defined period of time.

11. The system of claim 10, wherein selectively controlling the operation of the at least one switch device to maintain the electric current at the threshold during the defined period of time comprises:

opening, in response to the electric current reaching the fault current trip threshold, the at least one switch device to commutate the electric current to the varistor and cause the voltage to increase across the at least one switch device;

wherein the fault at the circuit breaker is determined based on a measured electric current at the circuit breaker exceeding a second threshold.

12. The system of claim 10, wherein the at least one switch device further comprises:

a second semiconductor device, wherein the first semiconductor device is in anti-series connection with the second semiconductor device;

wherein the first semiconductor device and the second semiconductor device comprise MOSFETs.

13. The system of claim 10, wherein the at least one switch device further comprises:

a second semiconductor device, wherein the first semiconductor device is in anti-parallel connection with the second semiconductor device;

wherein the first semiconductor device and the second semiconductor device comprise IGCTs.

14. The system of claim 10, wherein the at least one switch device comprises:

a first switch device, and a second switch device;

wherein the varistor comprises a first varistor in parallel connection with the first switch device and a second varistor in parallel connection with the second switch device.

15. The system of claim 14, wherein controlling the operation of the at least one switch device to maintain the electric current at the threshold during the defined period of time further comprises:

opening, in response to the electric current reaching the fault current trip threshold, one of the first switch device or the second switch device to commutate the electric current to a respective one of the first varistor or the second varistor and cause a voltage to increase across the one of the first switch device or the second switch device;

opening the circuit breaker of the one or more circuit breakers to clear the fault within the defined period of time; and closing, in response to opening the circuit breaker of the one or more circuit breakers, the one of the first switch device or the second switch device;

wherein the fault current trip threshold comprises a level $I_{th}$ such that $I_{th} > I_{thi}$, and $I_{th} < I_{th1}$, $I_{thi}$ being the fault current trip threshold of the circuit breaker and $I_{th1}$ being the fault current trip threshold of the SSSD.

16. The system of claim 15, wherein controlling the operation of the at least one switch device to maintain the electric current at the fault current trip threshold during the defined period of time further comprises:

opening, in response to failing to clear the fault within the defined period of time, an other of the first switch device and the second switch device to commutate the electric current to a respective first varistor or the second varistor to interrupt the electric current at the SSSD.

17. The system of claim 10, further comprising:

a controller, and wherein the controller is configured to send gate command signals to the at least one switch device to selectively turn ON and OFF the at least one switch device using a single turn-off shot, wherein the controller does not utilize pulse width modulation to control the operation of the at least one switch device.

18. A method for providing fault protection in a power circuit, the power circuit including a solid-state switching device (SSSD) comprising at least one switch device and a varistor connected in parallel across the at least one switch device, the SSSD connected upstream of one or more circuit breakers, the method comprising:

opening, by a controller in response to determining a fault at a circuit breaker of the one or more circuit breakers and based on an electric current reaching a threshold, the at least one switch device for a defined period of time to commutate the electric current to the varistor and cause a voltage across the at least one switch device to increase;

opening, by the controller, the circuit breaker of the one or more circuit breakers to clear the fault within the defined period of time; and closing, by the controller in response to opening the circuit breaker of the one or more circuit breakers and clearing the fault within the defined period of time, the at least one switch device;

wherein the controller is configured to send gate command signals to the at least one switch device to selectively turn ON and OFF the at least one switch device using a single turn-off shot, and wherein the controller does not utilize pulse width modulation to control an operation of the at least one switch device, wherein the varistor comprises a fault current limiting level configured to maintain the voltage across the at least one switch device consistent with a voltage in the power circuit while commutating the electric current during the defined period of time.

19. The method of claim 18, wherein the at least one switch device comprises a first switch device located on a first pole and a second switch device located on a second pole, and wherein opening the at least one switch device for the defined period of time comprises opening one of the first switch device or the second switch device for the defined period of time, and wherein the method further comprises:

opening, by the controller in response failing to clear the fault within the defined period of time, an other of the first switch device and the second switch device to commutate the electric current to the varistor connected in parallel to the other of the first switch device and the second switch device to interrupt the electric current at the SSSD.

* * * * *